(12) United States Patent
Sundström et al.

(10) Patent No.: US 11,239,850 B2
(45) Date of Patent: Feb. 1, 2022

(54) LEAKAGE COMPENSATION FOR A SUCCESSIVE APPROXIMATION ANALOG-TO-DIGITAL CONVERTER

(71) Applicant: Telefonaktiebolaget LM Ericsson (publ), Stockholm (SE)

(72) Inventors: Lars Sundström, Södra Sandby (SE); Mattias Palm, Bara (SE); Fredrik Tillman, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 703 days.

(21) Appl. No.: 16/076,114

(22) PCT Filed: Feb. 10, 2016

(86) PCT No.: PCT/EP2016/052852
§ 371 (c)(1),
(2) Date: Aug. 7, 2018

(87) PCT Pub. No.: WO2017/137078
PCT Pub. Date: Aug. 17, 2017

(65) Prior Publication Data
US 2021/0194490 A1 Jun. 24, 2021

(51) Int. Cl.
*H03M 1/10* (2006.01)
*H03M 1/06* (2006.01)
*H04B 1/16* (2006.01)

(52) U.S. Cl.
CPC ............ *H03M 1/0604* (2013.01); *H04B 1/16* (2013.01)

(58) Field of Classification Search
CPC ...... H03M 1/468; H03M 1/462; H03M 1/466; H03M 1/1245; H03M 1/46; H03M 1/38;
(Continued)

(56) References Cited

U.S. PATENT DOCUMENTS 8,344,925 B1 * 1/2013 Evans .................. H03M 1/462
341/155
8,884,801 B1 * 11/2014 Ranjbar ................ H03M 1/002
341/156
(Continued)

OTHER PUBLICATIONS

Cho, Sang-Hyun, et al., "A 550-uW 10-b 40-MS/s SAR ADC With Multistep Addition-Only Digital Error Correction", IEEE Journal of Solid-State Circuits, vol. 46, No. 8, Aug. 2011, pp. 1881-1892.
(Continued)

*Primary Examiner* — Linh V Nguyen
(74) *Attorney, Agent, or Firm* — Sage Patent Group

(57) ABSTRACT

An analog-to-digital conversion circuit (100) is disclosed. It comprises a switched-capacitor SAR-ADC, (110) arranged to receive an analog input signal (x(t)) and a clock signal, to sample the analog input signal (x(t)), and to generate a sequence (W(n)) of digital output words corresponding to samples of the analog input signal (x(t)), wherein the SAR-ADC (110) is arranged to generate a bit of the digital output word per cycle of the clock signal. It further comprises a clock-signal generator (120) arranged to supply the clock signal to the SAR-ADC (110), and a post-processing unit (140) adapted to receive the sequence (W(n)) of digital output words and generate a sequence of digital output numbers (y(n)), corresponding to the digital output words, based on bit weights assigned to the bits of the digital output words. The bit weights are selected to compensate for a decay of a signal internally in the SAR-ADC (110).

12 Claims, 13 Drawing Sheets

Fig. 13

(58) Field of Classification Search
CPC ...... H03M 1/804; H03M 1/12; H03M 1/1009; H03M 1/125; H03M 1/06; H03M 1/00; H03M 1/002; H03M 1/08; H03M 1/1071; H03M 1/0604; H04B 1/16
USPC .......... 341/118–120, 155, 161, 172
See application file for complete search history.

(56) References Cited

U.S. PATENT DOCUMENTS

| | | | | |
|---|---|---|---|---|
| 10,103,742 | B1* | 10/2018 | Guo ...................... | H03M 1/68 |
| 10,965,300 | B1* | 3/2021 | Weng .................. | H03M 1/0612 |
| 2004/0257257 | A1* | 12/2004 | Nomasaki ............. | H03M 1/124 |
| | | | | 341/172 |
| 2005/0231412 | A1* | 10/2005 | Confalonieri ......... | H03M 1/002 |
| | | | | 341/155 |
| 2008/0186214 | A1* | 8/2008 | Janakiraman ....... | H03M 1/0809 |
| | | | | 341/110 |
| 2009/0073018 | A1* | 3/2009 | Mitikiri ................ | H03M 1/145 |
| | | | | 341/156 |
| 2010/0097256 | A1* | 4/2010 | Hurrell ................ | H03M 1/145 |
| | | | | 341/143 |
| 2012/0326901 | A1* | 12/2012 | Zhao ..................... | H03M 1/06 |
| | | | | 341/118 |
| 2015/0180496 | A1* | 6/2015 | Drago .................... | H03M 1/38 |
| | | | | 341/122 |
| 2016/0182075 | A1* | 6/2016 | Devarajan ............ | H03M 1/128 |
| | | | | 341/120 |

OTHER PUBLICATIONS

Gan, Jianhua, "Non-Binary Capacitor Array Calibration for a High Performance Successive Approximation Analog-to-Digital Converter", Dissertation Presented to the Faculty of The Graduate School of The University of Texas at Austin in Partial Fulfillment of the Requirements for the Degree of Doctor of Philosophy, Dec. 1, 2003, pp. 1-188.

Hariprasath, V. , et al., "Merged capacitor switching based SAR ADC with highest switching energy-efficiency", Electronic Letters, vol. 46, No. 9, Apr. 29, 2010, pp. 1-2.

Hurrell, Christopher Peter, et al., "An 18 b 12.5 MS/s ADC With 93 dB SNR", IEEE Journal of Solid-State Circuits, vol. 45, No. 12, Dec. 2010, pp. 2647-2654.

Liu, Wenbo , "Low-Power High-Performance SAR ADC Design with Digital Calibration Techniques", Dissertation Submitted in partial fulfillment of the requirements for the degree of Doctor of Philosophy in Electrical and Computer Engineering in the Graduate College of the University of Illinois at Urbana-Champaign, Dec. 1, 2010, pp. 1-151.

Medawar, Samer, et al., "Postcorrection of Pipelined Analog-Digital Converters Based on Input-Dependent Integral Nonlinearity Modeling", IEEE Transactions on Instrumentation and Measurement, vol. 60, No. 10, Oct. 2011, pp. 3342-3350.

Verbruggen, Bob, et al., "A 2.1 mW 11b 410 MS/s Dynamic Pipelined SAR ADC with Background Calibration in 28 nm Digital CMOS", 2013 Symposium on VLSI Circuits Digest of Technical Papers, Jun. 12, 2013, pp. 1-2.

Zhang, Dai, et al., "Analysis and Calibration of Nonbinary-Weighted Capacitive DAC for High-Resolution SAR ADCs", IEEE Transactions on Circuitsand Systems—II: Express Beliefs, vol. 61, No. 9, Sep. 2014, pp. 666-670.

Huang, Xuan-Lun, et al., "An MCT-Based Bit-Weight Extraction Technique for Embedded SAR ADC Testing and Calibration", Journal of Electronic Testing, vol. 28, No. 5, Oct. 23, 2012, pp. 705-722.

Office Action issued in corresponding EP Application No. 16703802.5 dated Jan. 28, 2021, 09 Pages.

Swindlehurst, Eric et al. "Histogram-based calibration of capacitor mismatch in SAR ADCs," Electronic Letters IEE; vol. 5, No. 25; Dec. 2015; pp. 2096-2098.

* cited by examiner

US 11,239,850 B2

LEAKAGE COMPENSATION FOR A SUCCESSIVE APPROXIMATION ANALOG-TO-DIGITAL CONVERTER

TECHNICAL FIELD

The present invention relates to analog-to-digital conversion.

BACKGROUND

There are many analog-to-digital converter (ADC) architectures to choose from, each with its own merits and shortcomings. The successive approximation register (SAR) ADC and pipeline ADC are often combined to form a high speed ADC with 10 or more effective number of bits (ENOB). A SAR-ADC can be implemented using so called charge redistribution with a capacitive array using a switched-capacitor technique. Examples are provided e.g. in Hurrell, C. P.; Lyden, C.; Laing, D.; Hummerston, D.; Vickery, M., "An 18 b 12.5 MS/s ADC With 93 dB SNR," *Solid-State Circuits, IEEE Journal of*, vol. 45, no. 12, pp. 2647, 2654, December 2010, and Dai Zhang; Alvandpour, A., "Analysis and Calibration of Nonbinary-Weighted Capacitive DAC for High-Resolution SAR ADCs," *Circuits and Systems II: Express Briefs, IEEE Transactions on*, vol. 61, no. 9, pp. 666, 670, September 2014. This scheme also generates the residue, i.e. the analog remainder part after conversion to a given number of bits, that in turn can be used in a pipeline structure to be further processed in a second or more conversion stages.

In high-performance SAR-ADC architectures a merged capacitor switching (MCS) technique is often used. The MCS operation, which is illustrated in FIG. 1, is well known and e.g. described in V. Hariprasath, J. Guerber, S.-H. Lee, U.-K Moon, "Merged capacitor switching based SAR ADC with highest switching energy-efficiency," *Electronics Letters*, vol. 46, no. 9, pp. 620-621, April 2010 and S.-H. Cho, C.-K Lee, J.-K. Kwon, S.-T. Ryu, "A 550-uW 10-b 40-MS/s SAR ADC With Multistep Addition-Only Digital Error Correction," *Solid-State Circuits, IEEE Journal of*, vol. 46, no. 8, pp. 1881-1892, August 2011, and will not be further discussed in any greater detail.

Various sources of inaccuracies in a SAR-ADC cause the output signal from the SAR-ADC to deviate from the ideal output signal.

SUMMARY

An object of the present invention is to provide for corrections of imperfections in a SAR-ADC. In particular, the inventors have realized how leakage, or signal decay, within a SAR-ADC can impact the accuracy of the output signal of the SAR-ADC, and proposed a signal processing approach to counteract this.

According to a first aspect, there is provided an analog-to-digital conversion circuit. The analog-to-digital conversion circuit comprises a switched-capacitor SAR-ADC arranged to receive an analog input signal and a clock signal, to sample the analog input signal, and to generate a sequence of digital output words corresponding to samples of the analog input signal. The SAR-ADC is arranged to generate a bit of the digital output word per cycle of the clock signal. The analog-to-digital conversion circuit comprises a clock-signal generator arranged to supply the clock signal to the SAR-ADC, and a control unit arranged to control a rate of the clock signal. The analog-to-digital conversion circuit comprises a post-processing unit adapted to receive the sequence of digital output words and generate a sequence of digital output numbers, corresponding to the digital output words, based on bit weights assigned to the bits of the digital output words. The bit weights depend on the rate of the clock signal.

The post-processing unit may be adapted to gather statistics of samples of the sequence of digital output words of the SAR-ADC and determine the bit weights based on the statistics of samples of the sequence of digital output words.

The analog-to-digital conversion circuit may comprise an auxiliary ADC arranged to convert an analog residue of the SAR-ADC to a sequence, in the following referred to as residue sequence, of digital words corresponding to samples of said analog residue. The post-processing unit may be adapted to gather statistics of samples of the residue sequence, and determine the bit weights based on the statistics of samples of the residue sequence. The SAR-ADC may be a stage in a pipeline ADC, and the auxiliary ADC may be a subsequent stage in the pipeline ADC.

The post-processing unit may be adapted to determine a parameter representative of a time constant for a decay of a signal level in the SAR-ADC, and determine the bit weights based on said parameter.

According to a second aspect, there is provided an analog-to-digital conversion circuit. The analog-to-digital conversion circuit comprises a switched-capacitor SAR-ADC arranged to receive an analog input signal and a clock signal, to sample the analog input signal, and to generate a sequence of digital output words corresponding to samples of the analog input signal. The SAR-ADC is arranged to generate a bit of the digital output word per cycle of the clock signal. The analog-to-digital conversion circuit comprises a clock-signal generator arranged to supply the clock signal to the SAR-ADC. The analog-to-digital conversion circuit comprises a post-processing unit adapted to receive the sequence of digital output words and generate a sequence of digital output numbers, corresponding to the digital output words, based on bit weights assigned to the bits of the digital output words. The post-processing unit is adapted to determine a parameter representative of a time constant for a decay of a signal level in the SAR-ADC, and determine the bit weights based on said parameter.

The post-processing unit may be adapted to gather statistics of samples of the sequence of digital output word of the SAR-ADC and determine the parameter based on the statistics of samples of the sequence of digital output word.

The analog-to-digital conversion circuit may comprise an auxiliary ADC arranged to convert an analog residue of the SAR-ADC to a sequence, in the following referred to as residue sequence, of digital words corresponding to samples of said analog residue. The post-processing unit may be adapted to gather statistics of samples of the residue sequence, and determine the parameter based on the statistics of samples of the residue sequence.

The analog-to-digital conversion circuit may comprise a control unit arranged to control a rate of the clock signal. The bit weights may depend on the rate of the clock signal.

According to a third aspect, there is provided a receiver circuit comprising the analog-to-digital conversion circuit according to the first or the second aspect.

According to a fourth aspect, there is provided a communication apparatus comprising the receiver circuit according to the third aspect. The communication apparatus may e.g. be a wireless terminal or a network node.

According to a fifth aspect, there is provided a method of post processing data from a switched-capacitor SAR-ADC arranged to receive an analog input signal and a clock signal, to sample the analog input signal, and to generate a sequence of digital output words corresponding to samples of the analog input signal, wherein the SAR-ADC is arranged to generate a bit of the digital output word per cycle of the clock signal. The method comprises generating a sequence of digital output numbers, corresponding to the digital output words, based on bit weights assigned to the bits of the digital output words, wherein the bit weights depend on the rate of the clock signal.

According to a sixth aspect, there is provided a method of post processing data from a switched-capacitor SAR-ADC arranged to receive an analog input signal and a clock signal, to sample the analog input signal, and to generate a sequence of digital output words corresponding to samples of the analog input signal, wherein the SAR-ADC is arranged to generate a bit of the digital output word per cycle of the clock signal. The method comprises determining a parameter representative of a time constant for a decay of a signal level in the SAR-ADC. The method further comprises determining bit weights assigned to the bits of the digital output words based on said parameter. Moreover, the method comprises generating a sequence of digital output numbers, corresponding to the digital output words, based on the bit weights assigned to the bits of the digital output words.

According to a seventh aspect, there is provided a computer program product comprising computer program code for executing the method according to the fifth or sixth aspect when said computer program code is executed by a programmable post-processing unit of an analog-to-digital conversion circuit comprising the switched-capacitor SAR-ADC.

According to an eighth aspect, there is provided a computer readable medium having stored thereon a computer program product comprising computer program code for executing the method according to the fifth or sixth aspect when said computer program code is executed by a programmable post-processing unit of an analog-to-digital conversion circuit comprising the switched-capacitor SAR-ADC.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
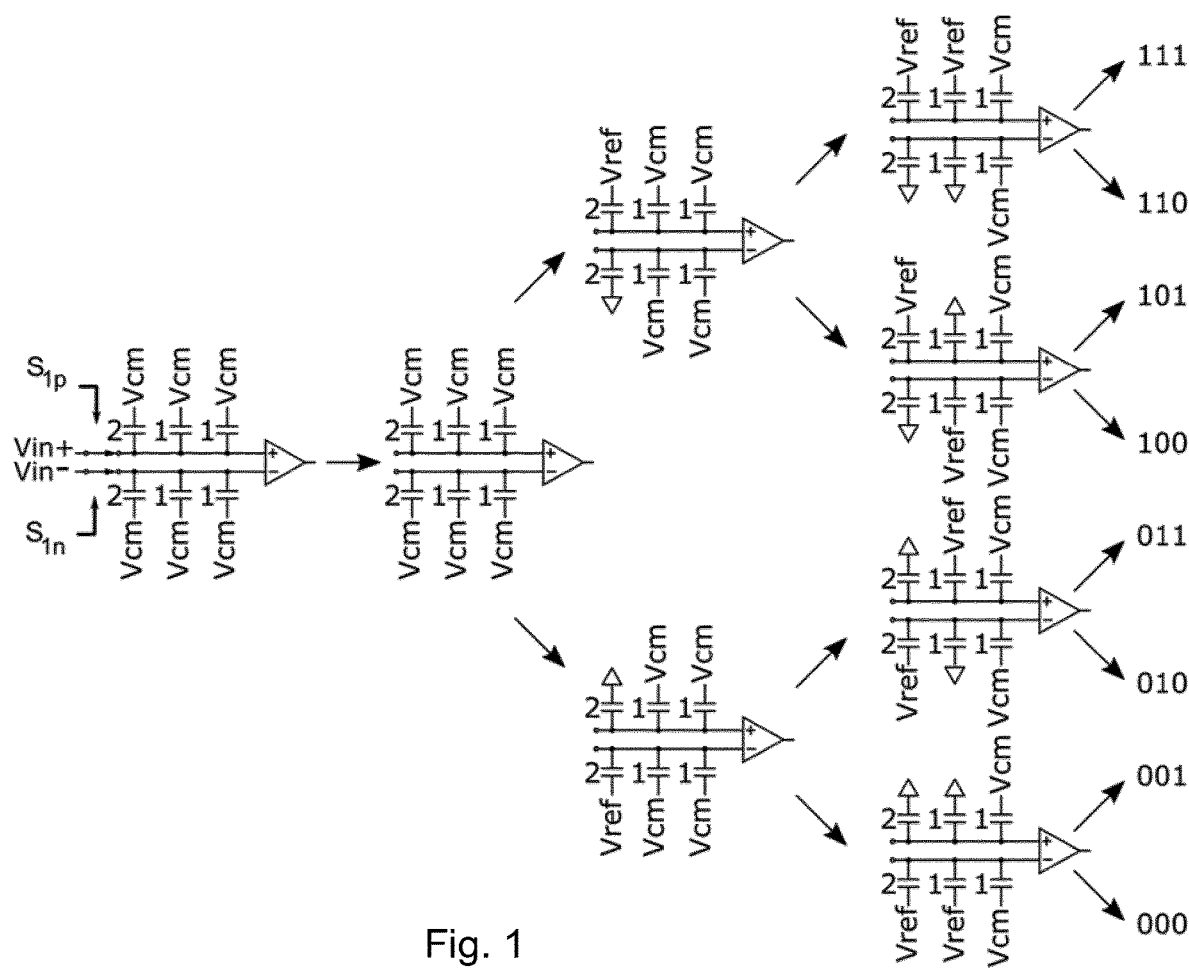
FIG. 1 illustrates principles for SAR-ADC operation.

In this disclosure, the MCS SAR-ADC shown in FIG. 1 represents an example implementation of a switched capacitor SAR-ADC used for illustration. Below, a problem associated with floating switch functionality to store charge from a sampled input signal, Vin+ and Vin−, is discussed. In FIG. 1, switches $S_{1p}$ and $S_{1n}$ need to provide a low enough on resistance, Ron, in order not to limit the signal bandwidth. On the other hand, during the SAR iteration process, $S_{1p}$ and $S_{1n}$, when being switched off, must not leak excessively and thereby discharge the capacitor array, and thus lower the differential voltage across the comparator input. Further, in the text that follows we refer to the iteration process as the sequence of operations required to determine each of the bits. Each iteration or iteration step refers to the determination of each bit by replacing the input common mode signal (CM) with a reference voltage (Vref) in a systematic pattern as illustrated in FIG. 1. The resulting sign of the comparator input voltage determines the value of the next less significant bit. The number beside each capacitor represents the weight of that capacitor. That is, the capacitors with weight 2 has 2 times as high capacitance as the capacitors with weight 1. FIG. 1 shows an example with a 3-bit SAR-ADC, with 3 pair of capacitors. In the general case with an N-bit SAR-ADC, there will be N pairs of capacitors weighted according to a binary weighted manner, as would be readily understood by a person skilled in the field of analog-to-digital conversion. The figure furthest to the left illustrates the sampling phase, with the switches $S_{1p}$ and Sin closed, and the next three columns of figures illustrates the SAR iteration process, with the switches $S_{1p}$ and $S_{1n}$ open. In the first iteration, the MSB is determined. If the comparator output is 'high', the MSB is set to '0', and the lower branch in the tree in FIG. 1 is followed. If, on the other hand, the comparator output is 'low', the MSB is set to '1', and the upper branch in the tree in FIG. 1 is followed. The remaining bits are determined in a similar fashion, as would be readily understood by a person skilled in the field of analog-to-digital conversion. Typically, the SAR-ADC is supplied with a clock signal, and during the SAR iteration process, the SAR-ADC is arranged to generate a bit of the digital output word per cycle of the clock signal. This clock signal should not be confused with the sampling clock signal, which has a lower rate, since each cycle of the sampling clock signal needs to accommodate several periods of said clock signal in order to allow all bits to be determined.

The inventors have realized that switches $S_{1p}$ and $S_{1n}$ in the capacitive SAR architecture (FIG. 1) will, in their OFF, state have a limited finite off resistance $R_{off}$ which in turn will lead to a discharge of the capacitor array, and lower the differential voltage seen by the comparator input. As a result, this may reduce the accuracy of the ADC depending on the technology being used to implement the ADC and more specifically the properties of the transistor being used to implement the switches. Also, the performance requirements in terms of ENOB and clock frequency will determine to which extent the problem will manifest itself.

Figure 2:
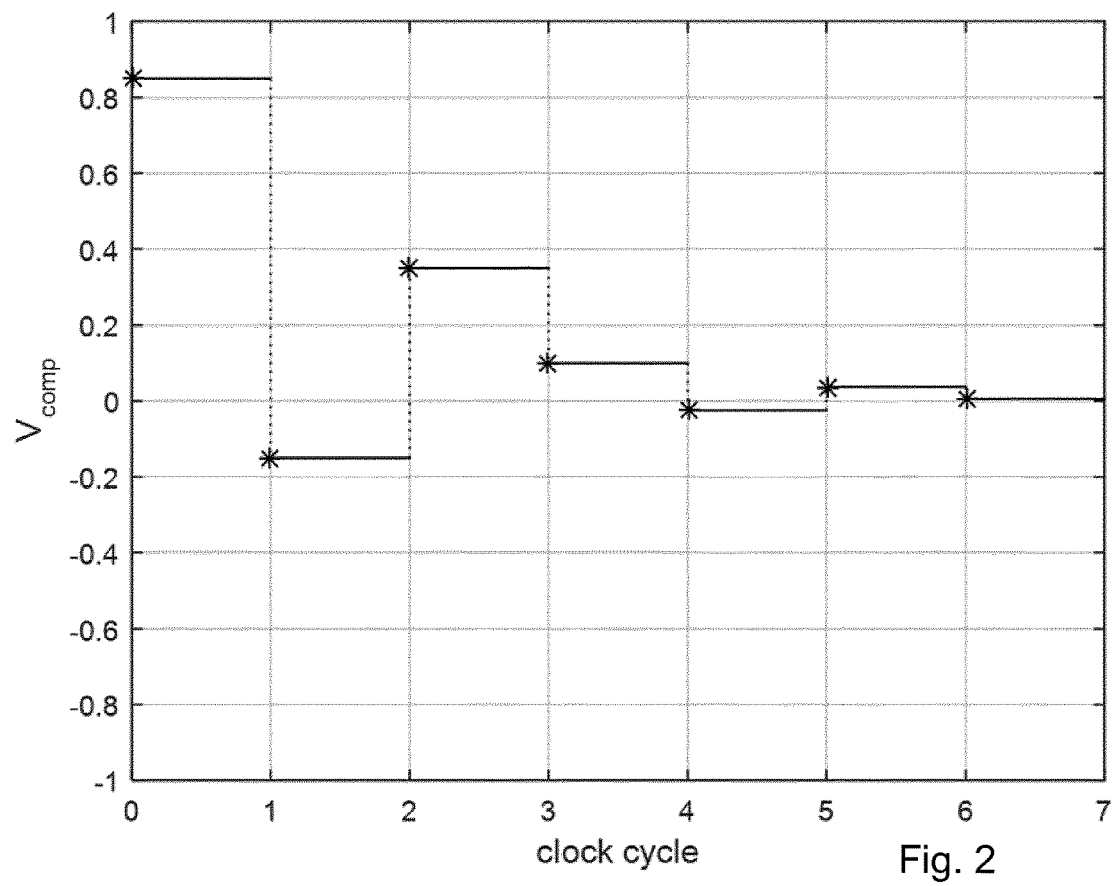
FIGS. 2-13 show plots representing ADC output data.

FIG. 2 below illustrates the SAR iteration process for an N-bit SAR-ADC (N=6) starting at t=0 with the input voltage and then, at each clock cycle, depending on the sign of the voltage from the previous clock cycle adding or subtracting a binary-weighted reference voltage, by charge redistribution of the reference voltages over the capacitor array. That is, what is illustrated in FIG. 2 is the differential input voltage, $V_{comp}$, to the comparator. FIG. 2 illustrates an ideal case with no discharge through the switches.

Figure 3:
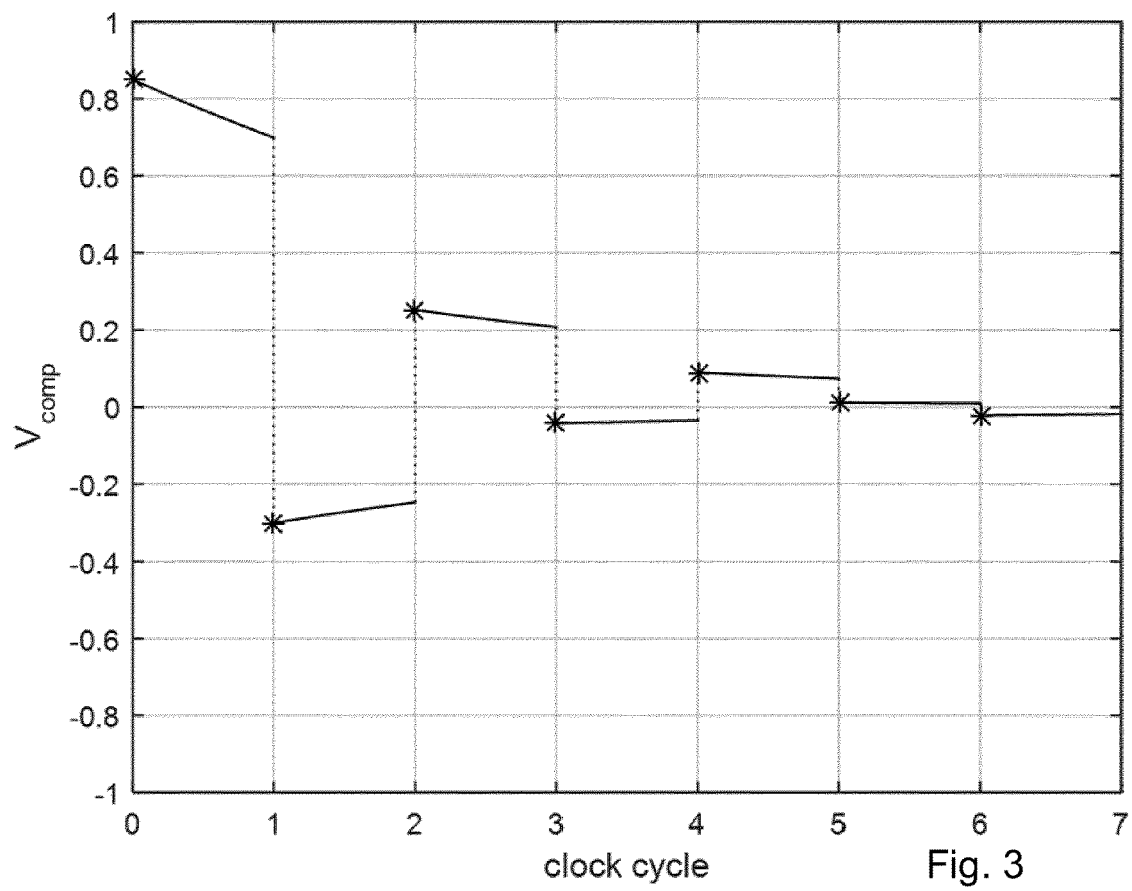

FIG. 3 repeats the iteration process but now with a discharge through $S_{1p}$ and $S_{1n}$, exaggerated for the purpose of illustration. For a small discharge, the output from the SAR-ADC will, for most samples, not differ from that of an ideal SAR-ADC. The residue will however change and the accuracy of the residue is of importance in a pipeline structure.

The inventors have realized that such a discharge gives rise to an error that manifests itself as incorrect bit weights of the SAR-ADC. The inventors have further realized that, for a given clock frequency, the resulting error is static. That is, it does not depend on the history of the input signal at previous sample instants, but only on the signal level at the current sampling instant. As is further elaborated on below, the inventors have also realized that the error can be compensated for by recombining the bits from the SAR-ADC output word into a number using modified (compared with the ideal) bit weights assigned to the different bits. Furthermore, the inventors have realized that the error depends on the clock frequency, such that in order to enable compensation in a SAR-ADC that can be operated at multiple clock frequencies, the values of the modified bit weights should depend on the clock frequency, or clock rate.

Now, the impact of discharge is discussed in some more detail. After the capacitor array has been charged to hold the voltage of the input signal, switches $S_{1p}$ and $S_{1n}$ are set to an OFF state and stick to that state throughout the SAR iteration process. The switches facing the other side of the capacitors will only alternate between the common mode (CM) level, reference voltage (Vref) and signal ground as a result of the SAR iteration process. Thus, for all practical purposes, the terminals of this side of the capacitors show low impedance and can be viewed as grounded. This means that the capacitor array will experience an exponential discharge proportional to $e^{-t/\tau}$ where t is time and $\tau=R_{off}C_{SAR}$. Here $R_{off}$ is the resistance of $S_{1p}$ and $S_{1n}$ respectively in OFF state and $C_{SAR}$ is the total capacitance of the capacitor array connected to each input of differential comparator. The parameter $\tau$ is a time constant for signal decay internally in the SAR-ADC.

Also, the capacitor array is linear and thus superposition applies. This can be used to understand how the discharge impacts the operation. $S_{1p}$ and $S_{1n}$ switch from track to hold state at a first time instant t=0. From there on the input signal decays as $e^{-t/\tau}$ until all bits have been determined. At subsequent clock cycles, $t=(n+1)T_{clk}$, ($T_{clk}$ being the clock period of SAR operation), of the SAR iteration process a charge is applied to yield a voltage offset from the previous voltage of either $V_{ref}/2^{n+1}$ or $-V_{ref}/2^{n+1}$ depending on the comparator output from previous clock cycle. This voltage too will decay as $e^{-t/\tau}$ but starting from $t=(n+1)T_{clk}$. In other words, when referenced to the time instant at which all bits and the residue voltage have been determined, the steps taken and thus the bits generated will not be binary weighted. Rather, the weight ratio between two consecutive bits n and n−1 becomes $$\frac{w_n}{w_{n-1}} = 2e^{\frac{-T_{clk}}{\tau}} \quad (1)$$

or slightly less than 2. Hence, if the weight of the LSB $b_0$ is set to $w_0=2^0=1$, the actual weights of the other bits are given by $$w_k = 2^k e^{-kT_{clk}/\tau} \quad (2)$$

If not corrected for, this will lead to performance degradation.

The $V_{comp}$ trajectories in FIG. 2 and FIG. 3 do not yield the same digital output codes (0b101101 versus 0b101011). Although the discharge in FIG. 3 is exaggerated, one can appreciate that even for a much smaller discharge, there will be a difference for some input signal levels when compared with the ideal SAR-ADC without discharge. What is perhaps more important is that the sum of the digital output of the capacitive SAR-ADC and its residue should ideally, without discharge, be equal to the input, but if one assume a binary weighting of the bits in presence of a discharge this will no longer hold. Since the residue and the input are in the voltage domain, and the digital output is in the digital number domain, the residue, input, and digital output mentioned in the preceding sentence should be interpreted as normalized values, normalized to the same dimensionless number domain as the digital output. The $V_{comp}$ values plotted in FIGS. 2 and 3 are such normalized values, normalized to the dimensionless range [−1,1], and the digital output should be considered as normalized to the same range for the purpose of understanding what is meant by the sum of the digital output and the residue.

At the end of the SAR iteration process, the residue is given by $$V_{residue} = V_{input} e^{-\frac{NT_{clk}}{\tau}} - \frac{V_{ref}}{2^N} \sum_{k=0}^{N-1} (2b_k - 1)w_k \quad (3)$$

Figure 4:
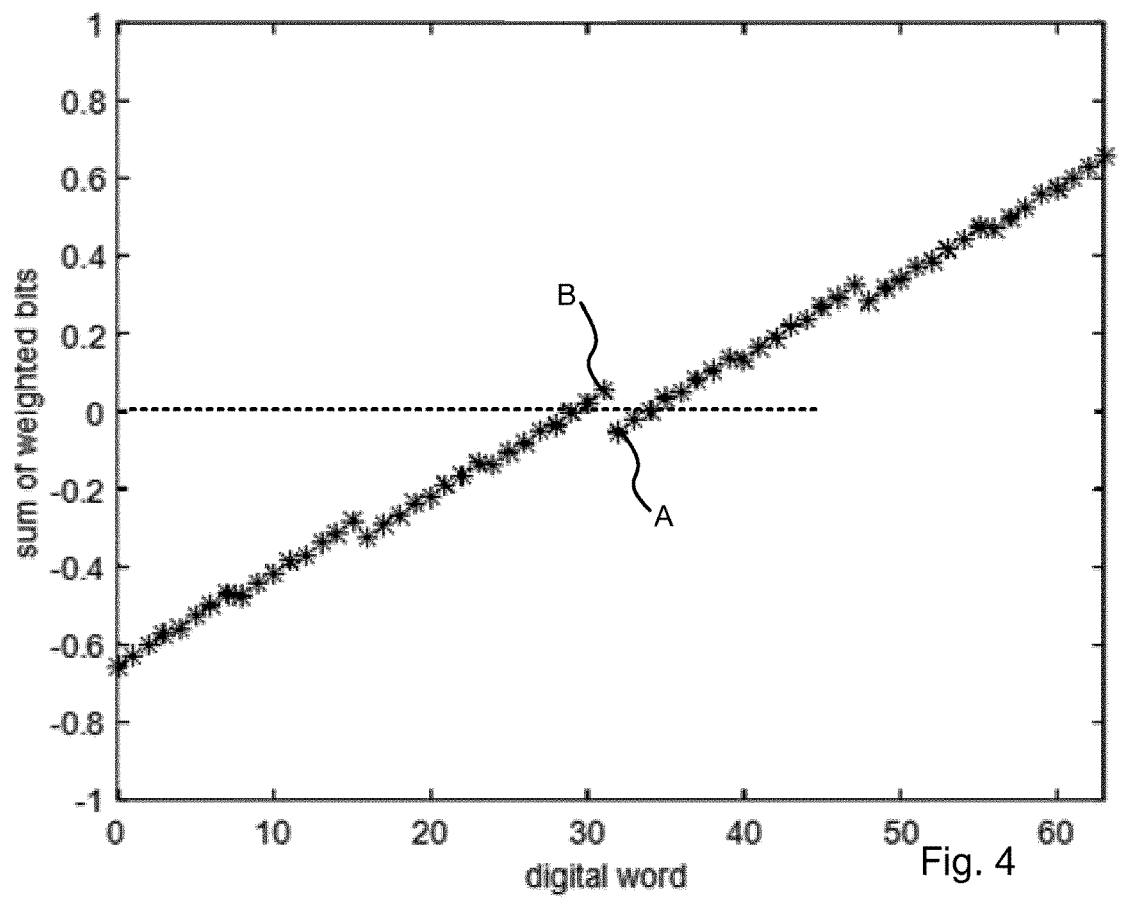
Figure 5:
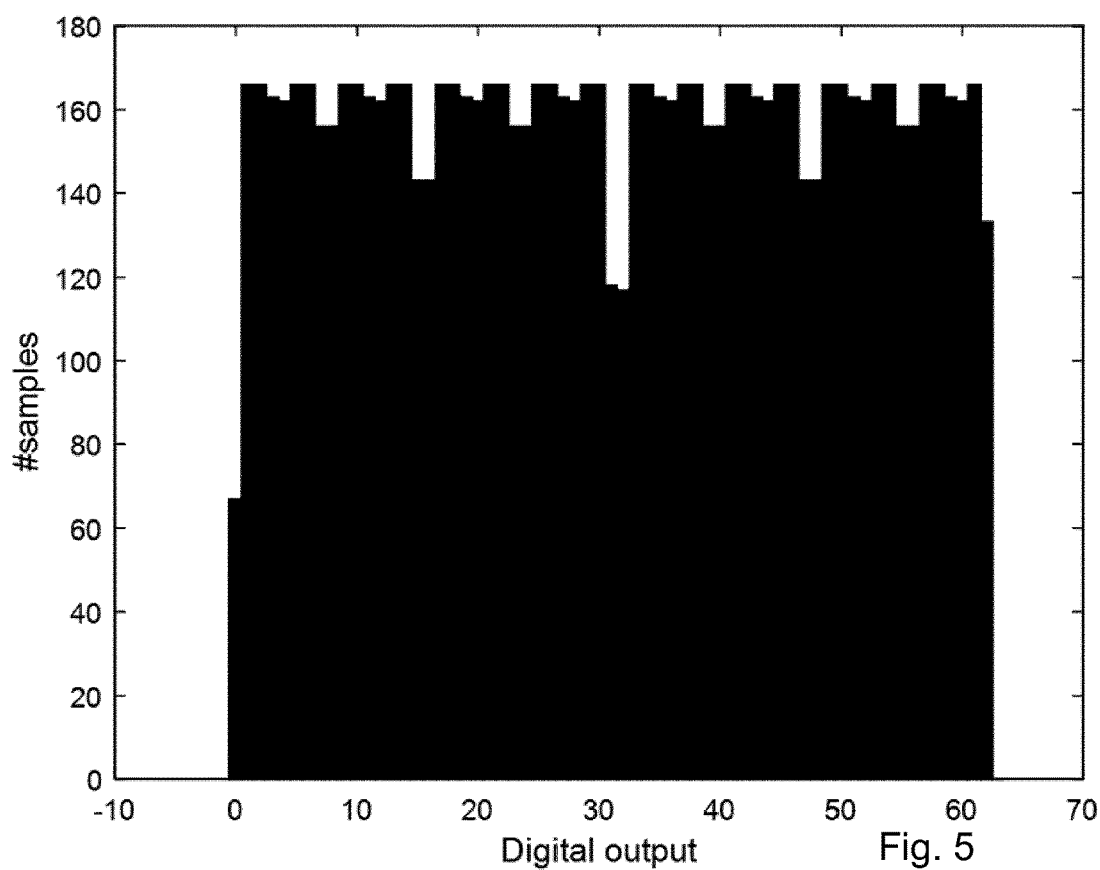

The first term is the sampled input voltage $V_{input}$ subject to a decay during the SAR iteration process. The second term, which we refer to below as the "output voltage", is the contribution provided during the SAR iteration process via charge redistribution, also subject to decay as captured by the $w_k$ factors. An observation that the inventors have made is that is that for the non-binary weights $w_k$, the output voltage range covered will not be uniform. If N=6 bits and $T_{clk}/\tau=0.1$ (exaggerated discharge for illustration purposes), then for each bit pattern of respective digital input code, which we label [0, 1 . . . , 63], where 0 corresponds to the binary code 000000, 1 corresponds to the binary code 000001, . . . , and 63 corresponds to the binary code 111111, to the capacitive array we get the distribution of sum of weighted bits as shown in FIG. 4 when referred to the time instant where the residue voltage is determined. This plot was based on a weighted sum calculated as $$S = \sum_{k=0}^{N-1} (2b_k - 1) 2^k e^{-\frac{kT_{clk}}{\tau}} = \sum_{k=0}^{N-1} (2b_k - 1) w_k \quad (4)$$

where $b_k=[0,1]$ The plotted values in FIG. 4 have been normalized to the range [−1, 1], as discussed above. Clearly, there are overlapping areas, foremost at the midpoint but also half-way on either side of the midpoint and so on. Out of the 64 input codes some 13 codes becomes redundant in that there is a similar output value for each of those codes. What will happen in practice is that some of the redundant codes will very rarely, or even never, be obtained at the SAR-ADC output, because another similar code in another range will be used. As a qualitative explanation, consider for example the data points marked A and B in FIG. 4. For point A, the MSB is '1', and the corresponding sum of weighted bits is negative. Since the MSB will only be set to '1' for a positive input voltage, this code will never be obtained, since there are other codes with an MSB='1' that have a corresponding sum of weighted bits closer to zero that will be used when the input voltage is just slightly above 0V.

Similarly, consider the data point marked B in FIG. 4. For point B, the MSB is '0', and the corresponding sum of weighted bits is positive. Since the MSB will only be set to '0' for a negative input voltage, this code will never be obtained, since there are other codes with an MSB='0' that have a corresponding sum of weighted bits is closer to zero that will be used when the input voltage is just slightly below 0V. More generally, some analog levels will be incorrectly mapped, because in the non-ideal transfer function caused by decay, they will have a closer fit to some code other than the "correct code" obtained with an ideal transfer function. Thus, even if the analog input voltage is uniformly distributed, the digital output words will have non-uniform distribution. To which degree the distribution will be non-uniform depends on the degree of decay. When the decay is considerably less than in this slightly exaggerated example, it might be so that all codes can be obtained at the SAR-ADC output, but due to the non-uniform output voltage distribution, some codes might be considerably rarer than would have been the case without decay.

The fact that the input signal sample is established in the circuit at a first time instant before a second time instant at which a SAR iteration k is performed to determine bit $b_k$ means that the input signal will discharge over a longer time than any of the voltage offsets introduced in the iteration process. We then can conclude that the voltage offsets will always be able to represent a larger range than the input signal at the time instant when the residue voltage is determined.

Some examples on how the decay affects the results are described below with reference to FIGS. 5-13. It should be noted when reference is made to "the digital output" in these examples, it is the uncompensated digital output, where the output bits from the SAR-ADC are interpreted as binary weighted. This is to illustrate what happens if the proposed compensation is not applied. Compensation, using non-binary weights, is then described after that.

Figure 6:
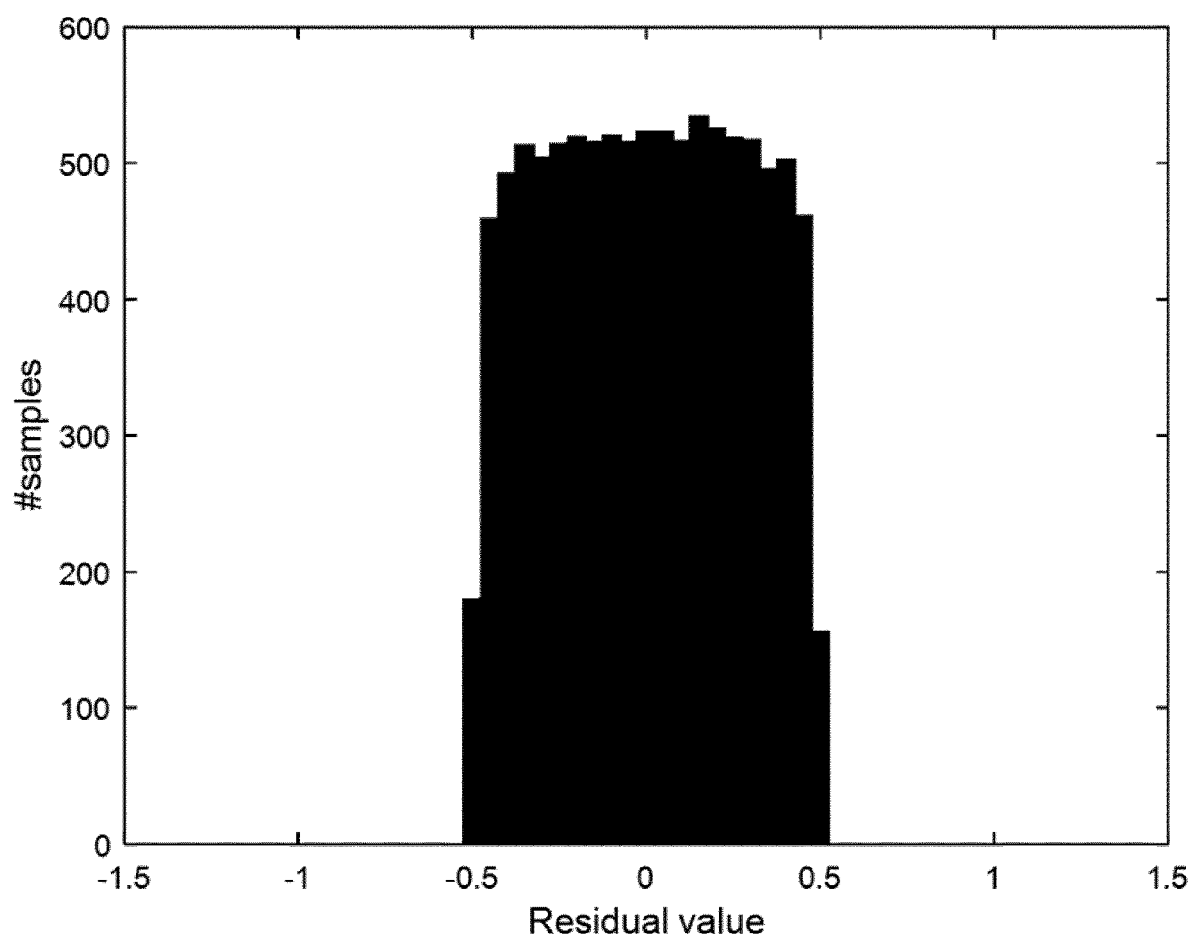
Figure 7:
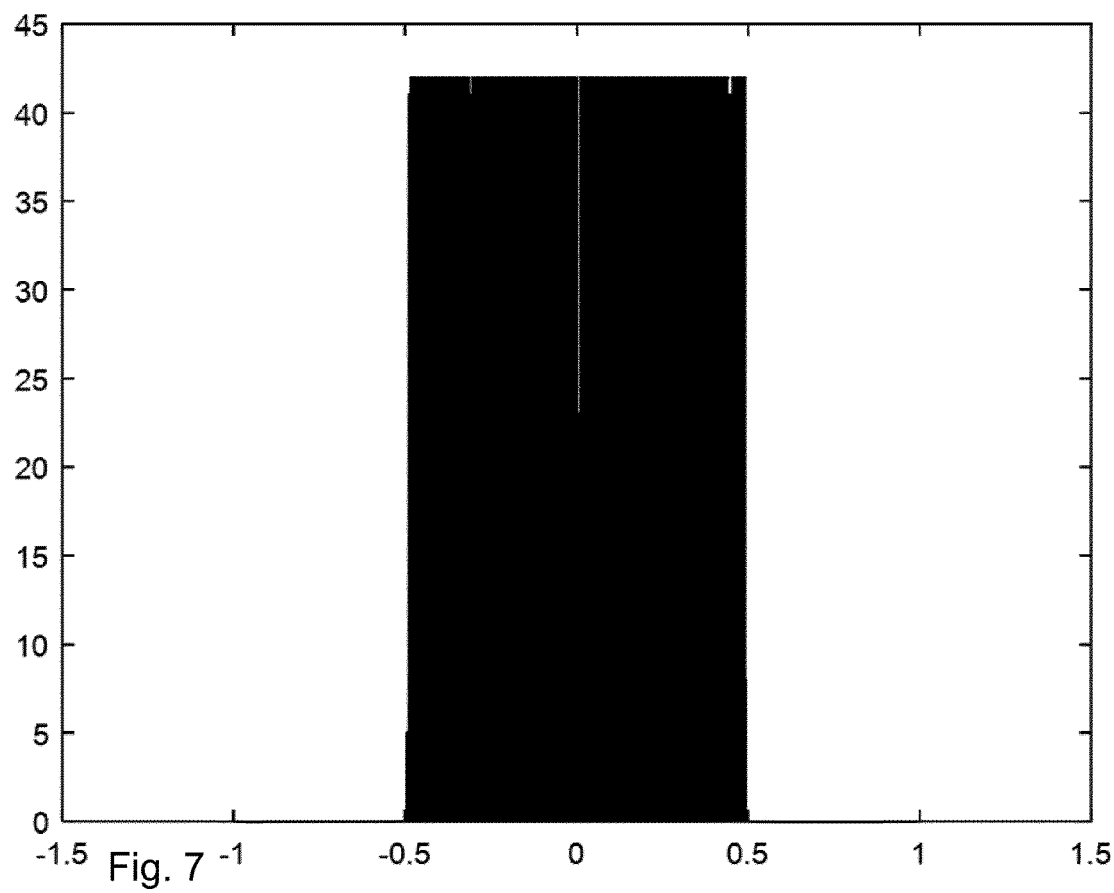
Figure 8:
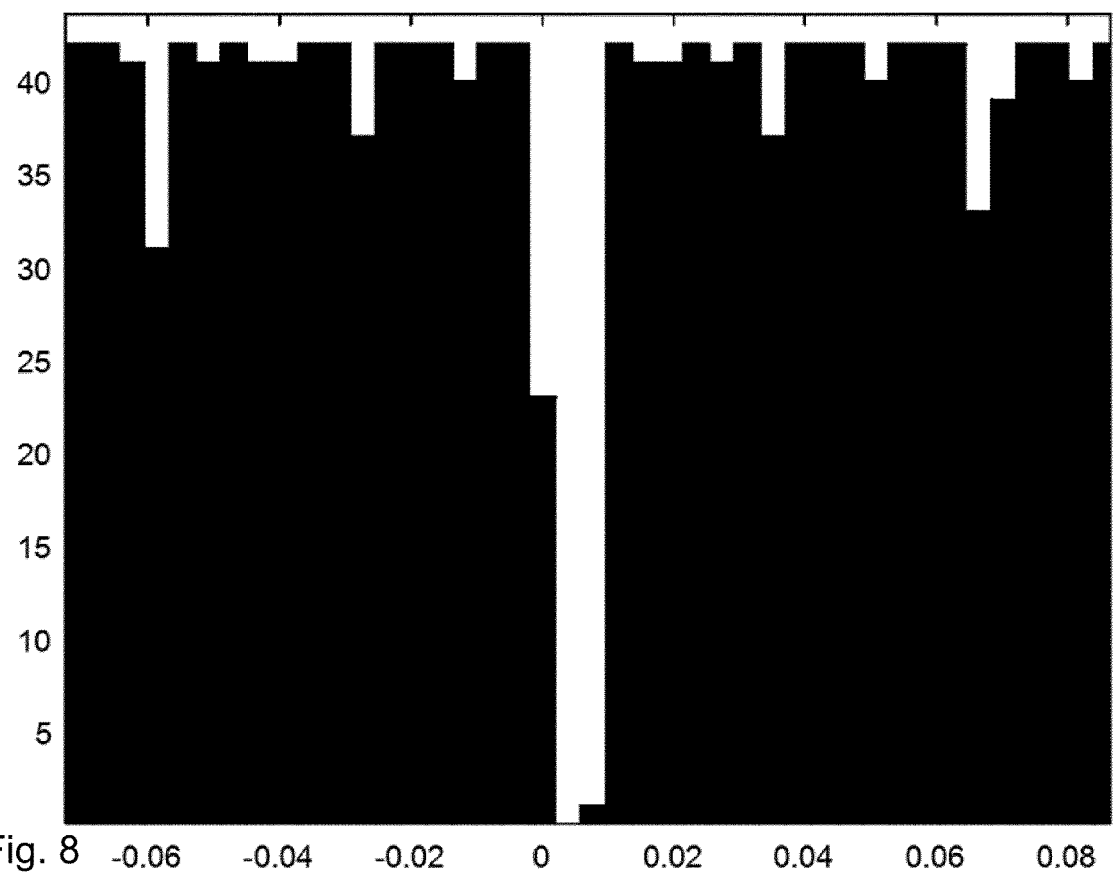
Figure 9:
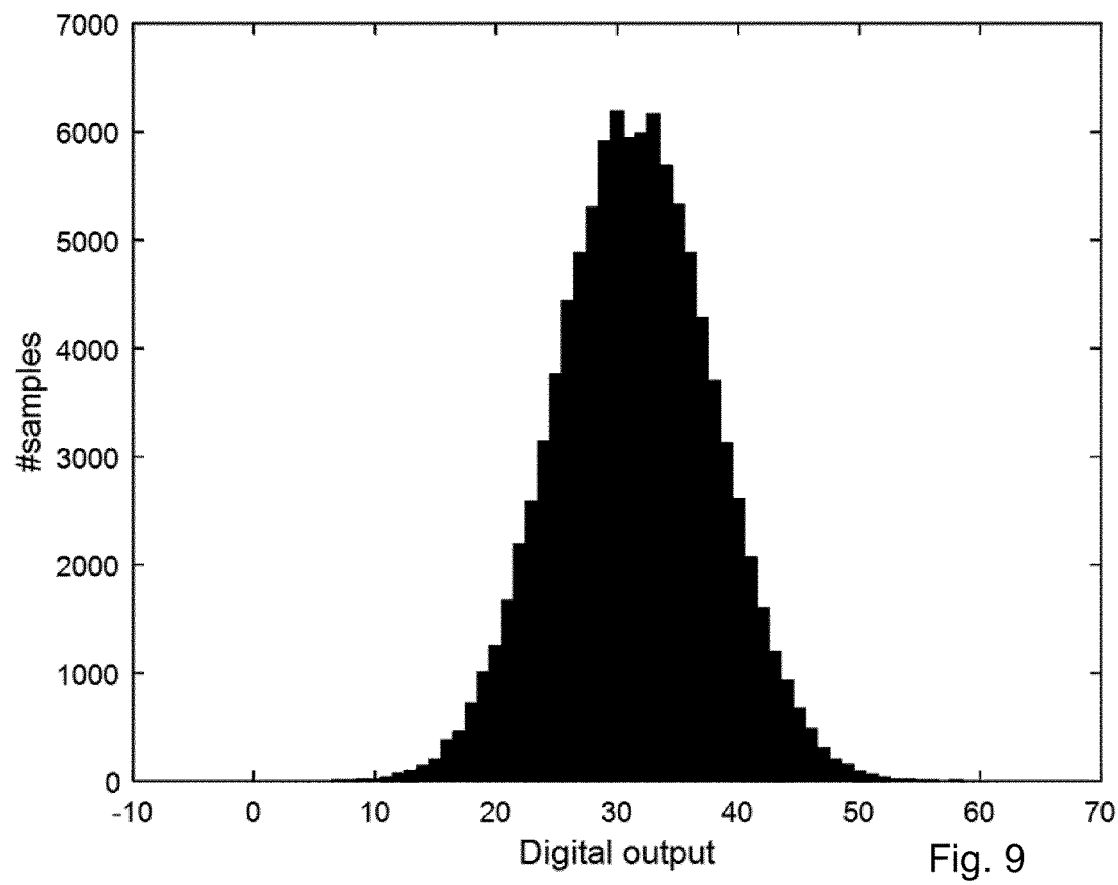

The SAR iteration process will be affected by this as the decisions taken are based on the comparator input voltage which in turn is a sum of decaying voltages where the input voltage part thus becomes a moving target. If N=6 bits and a discharge given by $T_{clk}/\tau$=0.01 (note, a factor 10 less than the previously used examples for more realistic data) it will be clearly visible by looking at the distribution of digital output, see FIG. 5. Here a slow ramp has been applied to the input of the SAR-ADC in the simulation. When there is no discharge the distribution would have been flat, but due to the discharge, there is now a clear drop around the midpoint and progressively less drop at the midpoints of each binary sub-division range. The residue distribution also becomes shaped as shown in FIG. 6. By adding the digital output to the residue (normalized as discussed above, with the bits of the digital output interpreted as binary weighted) this recombined signal should ideally (no discharge) equal the original input signal. But as shown in FIG. 7 there is also a drop in the distribution of this recombined signal (zoom-in around zero shown is shown in FIG. 8). What is shown in FIGS. 5-8 are histograms of the number of obtained samples at a given code (FIG. 5) or within a given interval (FIGS. 6-8).

Figure 10:
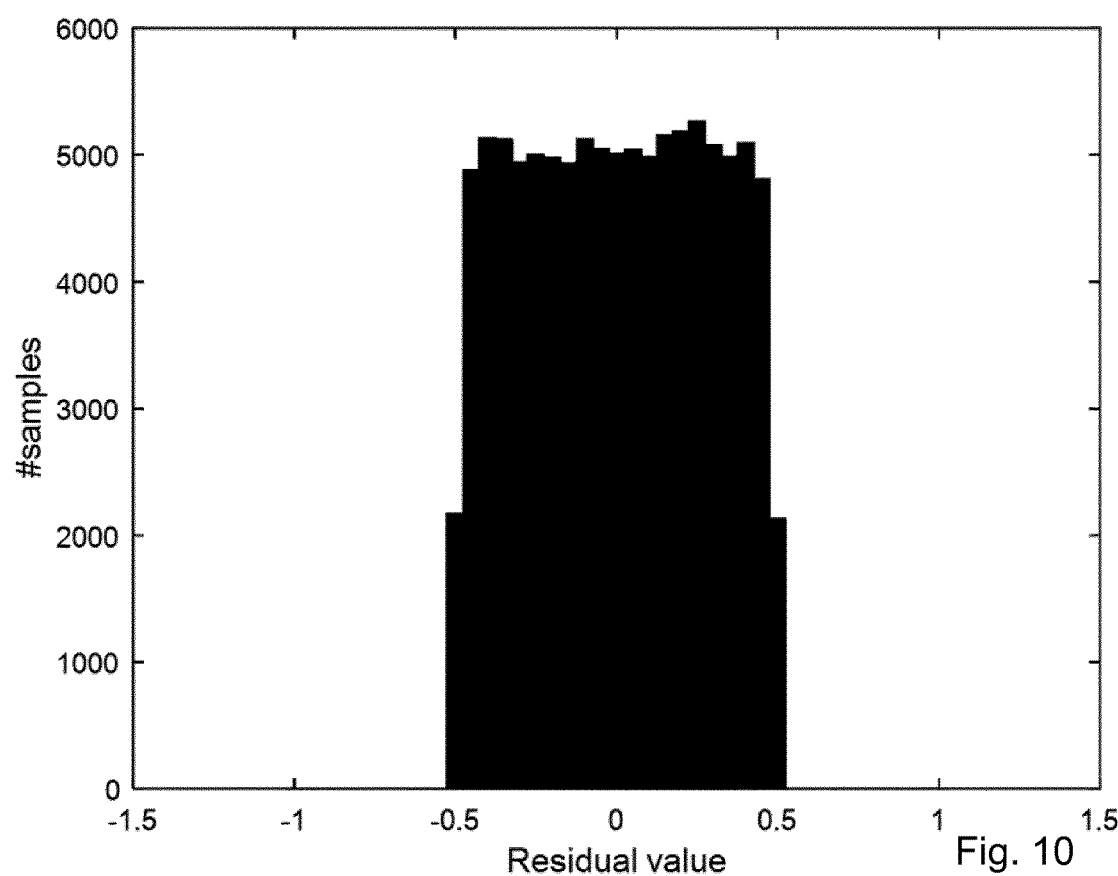
Figure 11:
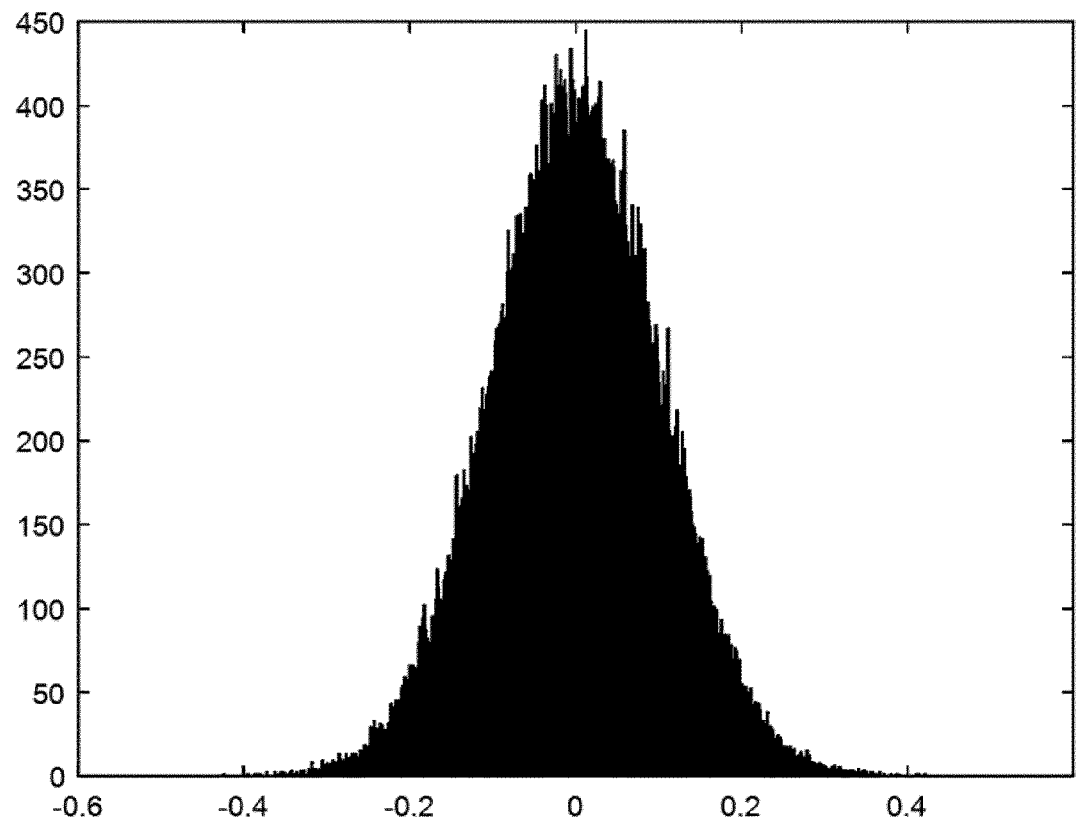
Figure 12:
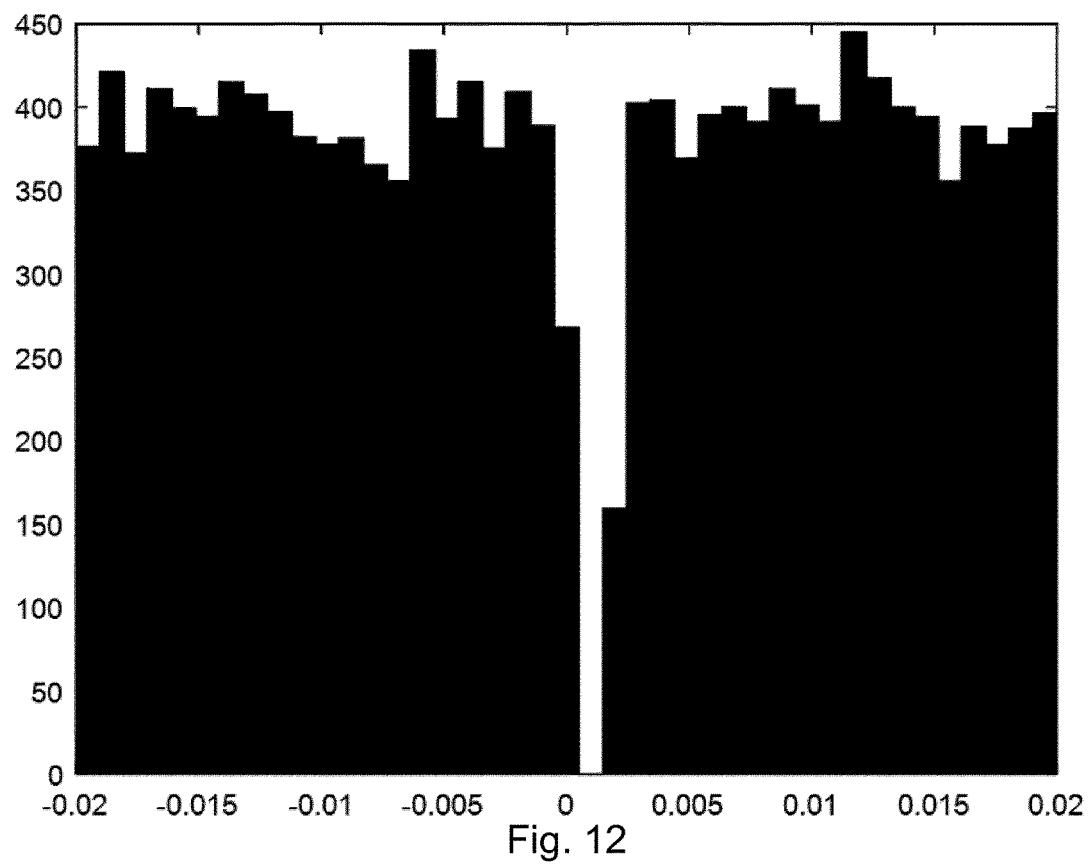

The same behavior can be seen for other signals as well and for much less discharge. With a Gaussian-distributed noise input of 100,000 samples and $T_{clk}/\tau$=0.002, the corresponding results are as shown in FIGS. 9-12. With such a small discharge there is however no clear effect on neither the digital output histogram (FIG. 9) nor the residue histogram (FIG. 10). The recombined signal histogram (FIGS. 11-12) however does reveal a clear drop at the midpoint.

Figure 13:
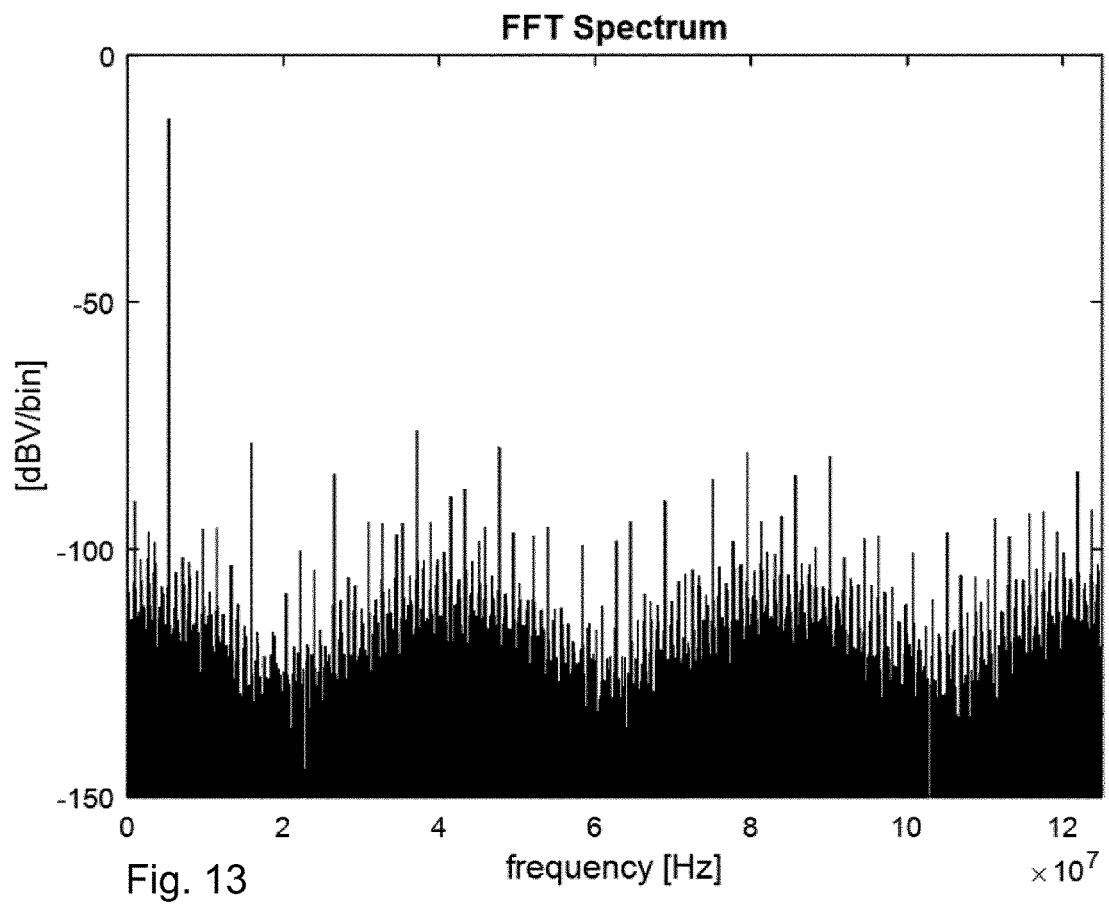

Finally, the distortion caused by the discharge can be investigated. The spectrum in FIG. 13 shows the recombined signal for a 6-bit SAR-ADC with 250 MHz clock frequency, $T_{clk}/\tau$=0.002, and a single tone at 5.3 MHz over 262144 samples. The SNDR is 57.8 dB but improves by 6 dB for every doubling of $\tau$.

We now proceed with describing procedures for compensating the errors caused by the leakage. As the real weight ratio of two subsequent bits can be written as $$\frac{w_k}{w_{k-1}} = 2e^{-T_{clk}/\tau} \tag{5}$$

it is proposed that the weights bits $b_k$ (k=0, ..., N−1) of the digital output be compensated by $e^{-kT_{clk}/\tau_c}$ to reflect the real weight of the bits where $\tau_c$ is the estimated discharge time constant. That is, instead of the ideal bit weight $w_{k,ideal}=2^k$, a compensated bit weight $w_k=c_{k,comp}w_{k,ideal}$, where $C_{k,comp}$ is a compensation factor, should be used. In some embodiments, the compensation factor is $$c_{k,comp} = e^{-\frac{kT_{clk}}{\tau_c}} \tag{6}$$

In other embodiments, approximations may be used for the compensation factor. For example, in case $NT_{clk} \ll \tau$, the discharge becomes almost linear $e^{-kT_{clk}/\tau_c} \approx (1-kT_{clk}/\tau_c)$, where the right hand side can be used as compensation factor, i.e.

$$c_{k,comp} = \left(1 - \frac{kT_{clk}}{\tau_c}\right) \tag{7}$$

which has a fairly low computational complexity. The compensated digital output, in the following denoted y(n), where n is a sequence index indicating the sampling instant, can now be calculated as $$y(n) = \sum_{k=0}^{N-1}(2b_k(n)-1)w_k = \sum_{k=0}^{N-1}(2b_k(n)-1)2^k c_{k,comp} \tag{8}$$

Note that the word length for representing y(n) can be different from the number N of bits $b_k$ in the output from the SAR-ADC. For example, the word length used for representing y(n) may be higher than N, e.g. to overlap with the bits generated by a subsequent ADC in a pipeline structure.

Figure 14:
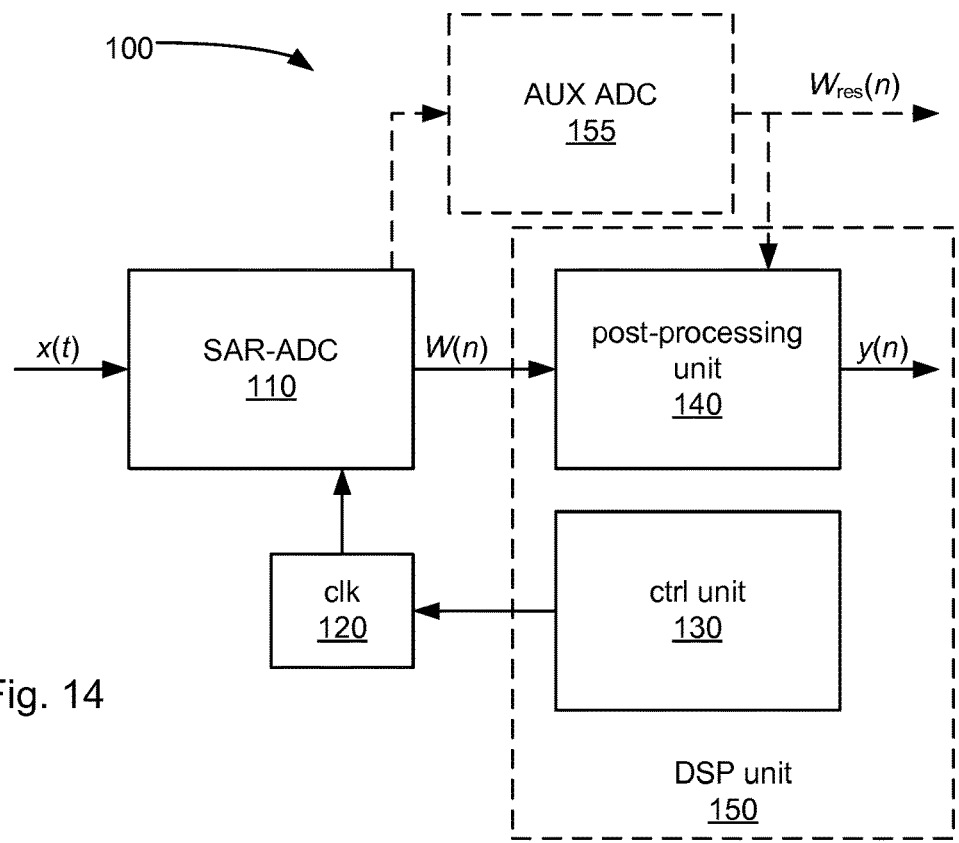
FIG. 14 is a block diagram according to an embodiment.

FIG. 14 is a simplified block diagram of an analog-to-digital conversion circuit 100. It comprises a switched-capacitor SAR ADC 110 arranged to receive an analog input signal x(t) and a clock signal. The SAR ADC 110 is further arranged to sample the analog input signal x(t) and to generate a sequence W(n) of digital output words corresponding to samples of the analog input signal x(t). The SAR-ADC 110 is arranged to generate a bit of the digital output word per cycle of the clock signal, as is e.g. described above with reference to FIG. 1. The analog-to-digital conversion circuit 100 further comprises a clock-signal generator 120 arranged to supply the clock signal to the SAR-ADC 110. It also comprises a control unit 130 and a post-processing unit 140. The post-processing unit 140 is adapted to receive the sequence W(n) of digital output words and generate a sequence of digital output numbers y(n) corresponding to the digital output words, based on bit weights $w_k$ assigned to the bits of the digital output words.

Some embodiments concern circuits where the rate of the clock signal is variable. For example, the analog-to-digital conversion circuit 100 may be used in a radio receiver circuit for sampling a received signal. The radio receiver circuit may be employed in a radio environment where the signals to be received may have a variable frequency bandwidth, and the selected sampling frequency of the analog-to-digital conversion circuit 100 may depend on the current bandwidth. The above-mentioned clock signal is not a sampling clock signal, but it is related to the sampling clock signal in that, for each period of the sampling clock signal, the clock signal needs to complete a certain number of periods in order for all the bits of W(n) to be generated before the next sample is sampled. Hence, also the rate of the clock signal might be varied, e.g. in accordance with a selected bandwidth. In view of the analysis provided above, the inventors have realized that by allowing the bit weights to depend on the rate of the clock signal, compensation of the leakage errors described above is enabled in variable clock-rate scenarios. Hence, in accordance with some embodiments, the control unit 130 is arranged to control the rate of the clock signal, wherein the bit weights applied by the post-processing unit 140 depend on the rate of the clock signal.

It should be noted though that the approaches and methods described herein for generating bit weights and compensating for signal decay internally in the SAR-ADC 110 are applicable also in implementations where the rate of the clock signal is fixed.

As indicated in FIG. 14, the post processing unit 140 and/or the control unit 130 may be part of a digital signal processing (DSP) unit 150. The DSP unit 150 may comprise one or more application-specific hardware units. Alternatively, the DSP unit 150 may comprise one or more programmable hardware units, such as one or more digital signal processors.

In line with what has been described above, the post-processing unit 140 is, in some embodiments, adapted to gather statistics of samples of the sequence W(n) of digital output words of the SAR-ADC 110 and determine the bit weights $w_k$ based on the statistics of samples of the sequence W(n) of digital output words. For example, as has been described above, it can be foreseen, in the presence of leakage, that certain codes are expected to be less frequently occurring than other codes in the sequence W(n). That is, these certain codes are in some sense more sensitive to leakage than other less sensitive codes, that will occur in more or less the same numbers regardless of the amount of leakage. Examples of such more sensitive codes are the "middle codes" '100 . . . 00' and '011 . . . 111'. In some embodiments, the relative occurrence of one or more such sensitive codes is compared with the relative occurrence of one or more such less sensitive codes. Such a comparison can provide a measure of the degree of leakage, or "signal decay", internally in the SAR ADC, and can be used as a basis for selecting the bit weights $w_k$. For example, simulations can be used to estimate the relative occurrences for the different codes for different degrees of leakage, e.g. different values of $\tau_{clk}/\tau$. For example: "for a given degree of leakage A, the code B is expected to occur in C % more cases than the code D". Based on this estimated data, the gathered statistics can be used to estimate the actual leakage and consequently to select the appropriate bit weights $w_k$, e.g. based on a table look up. Alternatively, the leakage, or signal decay, can be estimated iteratively, e.g. in terms of a parameter such as $\tau_c$ or $T_{clk}/\tau_c$. For example, a start value of the parameter can be selected e.g. as a default value or by means of a table look-up based on gathered statistics as mentioned above. Bit weights $w_k$ can then be assigned based on the parameter value. Subsequently, statistics can be gathered on the compensated sequence of numbers y(n), whereby conclusions can be made regarding whether the resulting compensation was insufficient (e.g. $\tau_c$ was selected too large or equivalently $\tau_{clk}/\tau_c$ was selected too small), correct, or too much (e.g. $\tau_c$ was selected too small or equivalently $T_{clk}/\tau_c$ was selected too large). The parameter, and corresponding bit weights, can then be updated if needed, iteratively until a satisfactory statistical distribution of the sequence y(n) is obtained.

In some implementations, as described above, the statistics of W(n) might be too coarse in resolution, e.g. due to too few bits in the SAR-ADC 110, to properly reflect the signal decay. For example, if the SAR-ADC 110 is a stage in a pipeline ADC, the effects of the signal decay in the SAR-ADC 110 might be visible first in a subsequent stage of the pipeline ADC.

As described above, in addition to the statistics of the sequence W(n), the residue signal can be considered in the computation of the bit weights $w_k$. Thus, as indicated in FIG. 14, some embodiments of the analog-to-digital conversion circuit 100 comprises an auxiliary ADC 155 arranged to convert an analog residue of the SAR-ADC 110 to a sequence $W_{res}(n)$, of digital words corresponding to samples of said analog residue. In the following, the sequence $W_{res}(n)$ is referred to as "residue sequence". In such embodiments, the post-processing unit 140 is adapted to gather statistics of samples of the residue sequence $W_{res}(n)$, and determine the bit weights $w_k$ based on the statistics of samples of the residue sequence $W_{res}(n)$.

In some embodiments, the auxiliary ADC 155 is a subsequent stage in a pipeline ADC. This is advantageous in that no additional dedicated ADC is needed for converting the residue.

In some embodiments, the post-processing unit 140 is adapted to determine a parameter representative of a time constant for a decay of a signal level in the SAR-ADC 110, and determine the bit weights based on said parameter. The parameter may e.g. be $\tau_c$ or $\tau_{clk}/\tau_c$ mentioned above, but any other function of $\tau_c$ may be considered for use as well. The postprocessing unit 140 can then determine the bit weights $w_k$ based on said parameter. For example, the bit weights $w_k$ may be determined based on Eq. (6) or Eq. (7).

Figure 15:
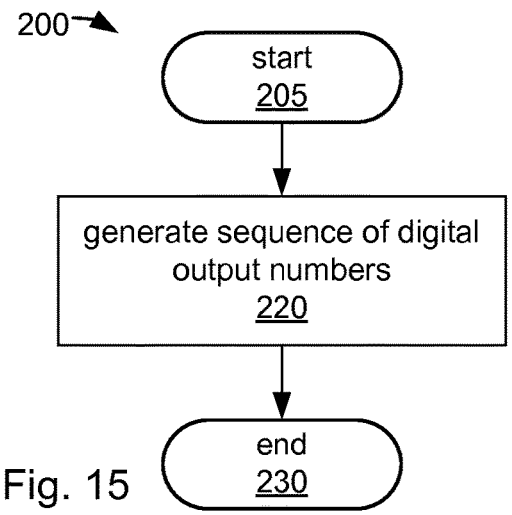
FIGS. 15-20 show flowcharts according to embodiments.

Some embodiments concern a method 200 of post processing data from the switched-capacitor SAR-ADC 110. The method 200 may e.g. be performed by the post-processing unit 140 (Fig. The method 200 is generally illustrated with a flowchart in FIG. 15. The operation is started in step 205. The method 200 comprises step 220 of generating the sequence y(n) of digital output numbers, corresponding to the digital output words W(n), based on bit weights $w_k$ assigned to the bits of the digital output words. The operation is ended in step 230.

As for some of the embodiments of the analog-to-digital conversion circuit 100 described above, some of the embodiments of the method 200 concerns a situation where the rate of the clock signal is variable. In such embodiments of the method 200, wherein the bit weights $w_k$ depend on the rate of the clock signal.

Figure 16:
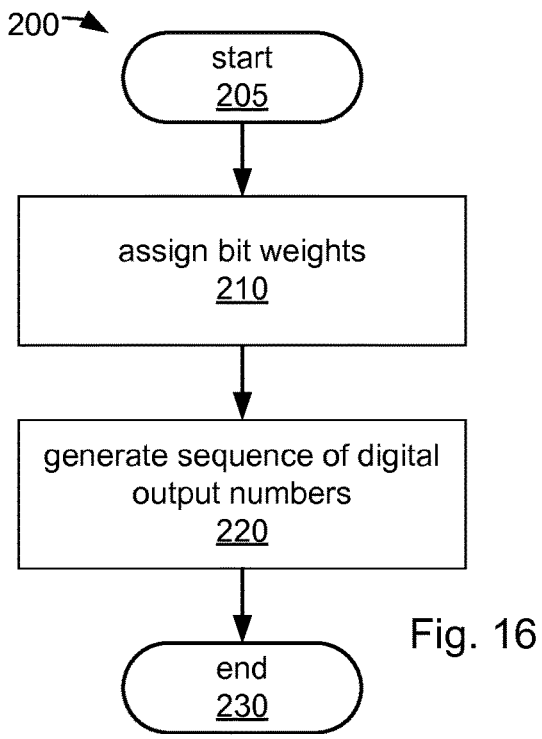

As illustrated in FIG. 16, some embodiments of the method 200 includes the step 210 of assigning the bit weights $w_k$.

Figure 17:
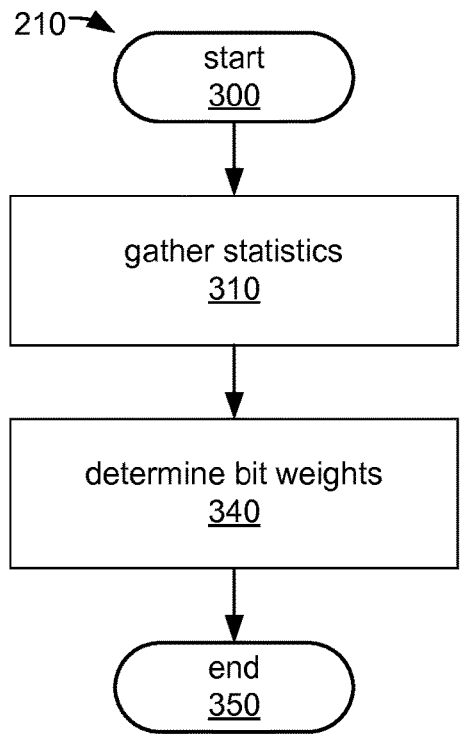

FIG. 17 illustrates an embodiment of step 210. The operation of step 210 is started in step 300. In FIG. 17, step 210 includes the step 310 of gathering statistics. Step 310 may include gathering statistics of the sequence W(n). Additionally or alternatively, step 310 may include gathering statistics of the residue sequence $W_{res}(n)$. For example, the gathered statistics may be statistics of the sequence of pairs $\{W(n), W_{res}(n)\}$. This sequence of pairs can be used to form a sequence referred to as a recombined sequence, or recombined signal, $$y_{recombined}(n)=y(n)+y_{res}(n) \quad (9)$$

where $y_{res}(n)$ is a sequence of digital numbers corresponding to the analog residue signal formed as a weighted combination of the bits of $W_{res}(n)$, e.g.

$$y_{res}(n) = C\sum_{k=0}^{N-1} (2d_k(n) - 1)u_k \quad (10)$$

where $d_k(n)$ are the bits of $W_{res}(n)$, M is the number of bits of $W_{res}(n)$, $u_k$ is the weight of bit $d_k(n)$, and C is a normalization constant. If the auxiliary ADC is binary weighted, the weights $u_k$ may be selected as $$u_k=2^k \quad (11)$$

and the normalization constant C may be selected as $$C=2^{-M} \quad (12)$$

thus giving the MSB of $W_{res}(n)$ an effective weight of $C \cdot u_{M-1} = \frac{1}{2}$.

The above example normalization assumes that the input range of the auxiliary ADC 155 exactly fits the expected range of the residue voltage. In some implementations, some degree of redundancy, e.g. in terms of an extra bit, may be introduced in the auxiliary ADC 155 to obtain a design margin so that the input range of the auxiliary ADC 155 is slightly larger than the expected range of the residue voltage. In such cases, the normalization constant should be adjusted accordingly. Making such an adjustment, which corresponds to determining the bit weights of the bits in the auxiliary ADC 155 in relation to the bit weights of the SAR-ADC 110, would be a routine task for a person skilled in the art of pipeline ADC design and is not further discussed herein.

In the presence of non-negligible signal decay, and in the absence of compensation, or with the signal decay being undercompensated ($\tau_c > \tau$), the histogram of the recombined signal $y_{recombined}(n)$ will have zero-value entries, or at least values lower than surrounding ranges, in a region the center of the number range (as shown in FIG. 8). The width of this region is a measure of the compensation needed. If the error is small there might be no zero-value entries and then only the value of one histogram entry at the center will be lower compared with average of the neighboring entries. If the discharge is overcompensated ($\tau_c < \tau$) there will instead be an increased density in the center of the histogram.

In other words, if the signal decay has been correctly compensated for, by means of an adequate selection of bit weights $w_k$, the recombined sequence $y_{recombined}(n)$ should be equal to (a digital representation of) the input signal x(t). Thus, a histogram of $y_{recombined}(n)$ would then have a smooth distribution. However, as described above with reference to FIGS. 11-12, with incorrect bit weights, e.g. without any compensation, there will be relatively abrupt deviations from such a smooth distribution at certain points, e.g. the midpoint of the number range for $y_{recombined}(n)$. By iteratively adjusting the bit weights $w_k$ until a smooth distribution for $y_{recombined}(n)$ is obtained, correct bit weights $w_k$ can be derived. In some embodiments, a first point or smaller sub range of the number range of $y_{recombined}(n)$, which is known statistically sensitive to incorrect bit weights, such as the midpoint or a small neighborhood of the midpoint, is compared with a neighboring second point or sub range which is known not to be particularly statistically sensitive to incorrect bit weights. The difference in the number of samples between the first and second point or subrange indicate how well the selected bit weights $w_k$ compensate for the signal decay. A control loop can be used to iteratively tune the selected bit weights. For example, if the selected bit weights are selected based on an estimate of the parameter $T_{clk}/\tau_c$, which we refer to in the following as the parameter $P_c$ for brevity, the following algorithm can be used, where $m_1$ denotes the number of samples of $y_{recombined}(n)$ in the first point or subrange, and $m_2$ denotes the number of samples of $y_{recombined}(n)$ in the second point or subrange:

1) gather statistical data
2) determine $m_1$ and $m_2$
3a) if $m_1 < m_2$, then increase $P_c$
3b) if $m_1 > m_2$, then decrease $P_c$
4) compute bit weights based on P, then return to 1)

In 3a) and b) above, it is not defined what to do if $m_1 = m_2$. In some embodiment, the bit weights are left unchanged. In other embodiments, "<" in 3b) is replaced with "≤", or ">" in 3a) is replaced with "≥". This has the computational advantage that only one of the comparisons in 3a) and 3b) has to be computed, since the result of one of the comparisons automatically gives the result of the other comparisons as its logical inverse. In case the first and second sub ranges are equally wide, the numbers $m_1$ and $m_2$ may be the actual number of samples in the respective range. If the first and second sub ranges are not equally wide, the numbers $m_1$ and $m_2$ may instead denote an average number of samples per unit width of the respective range, e.g. derived by dividing the actual number of samples in a range with the width of that range.

Figure 18:
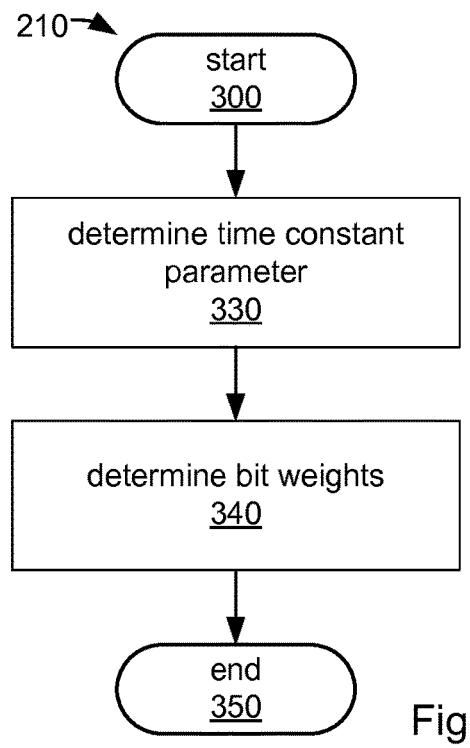
Figure 19:
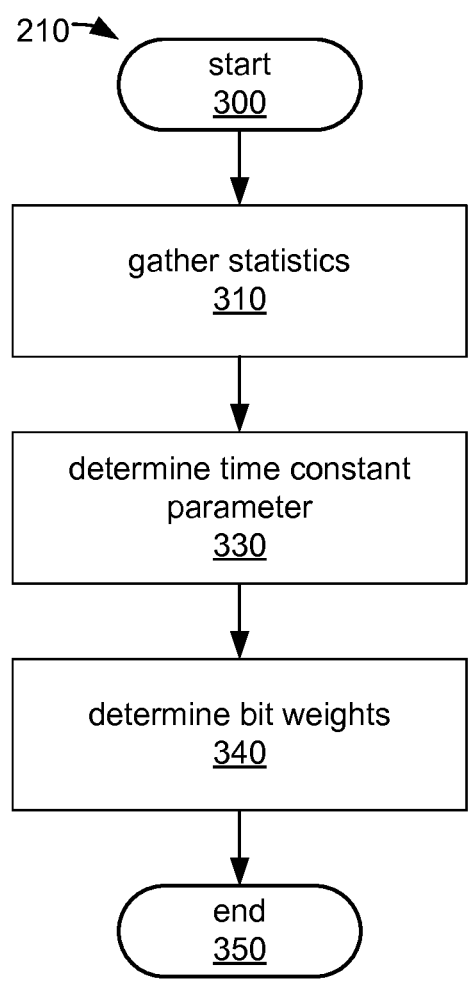

As has been outlined above, step 210 may thus comprise a step 330 of determining a parameter representative of a time constant for a decay of a signal level in the SAR-ADC 110. This is illustrated in the flow chart in FIG. 18. For example, the determination in step 330 can be based on the statistics gathered in step 310, which is illustrated in the flow chart in FIG. 19.

Figure 20:
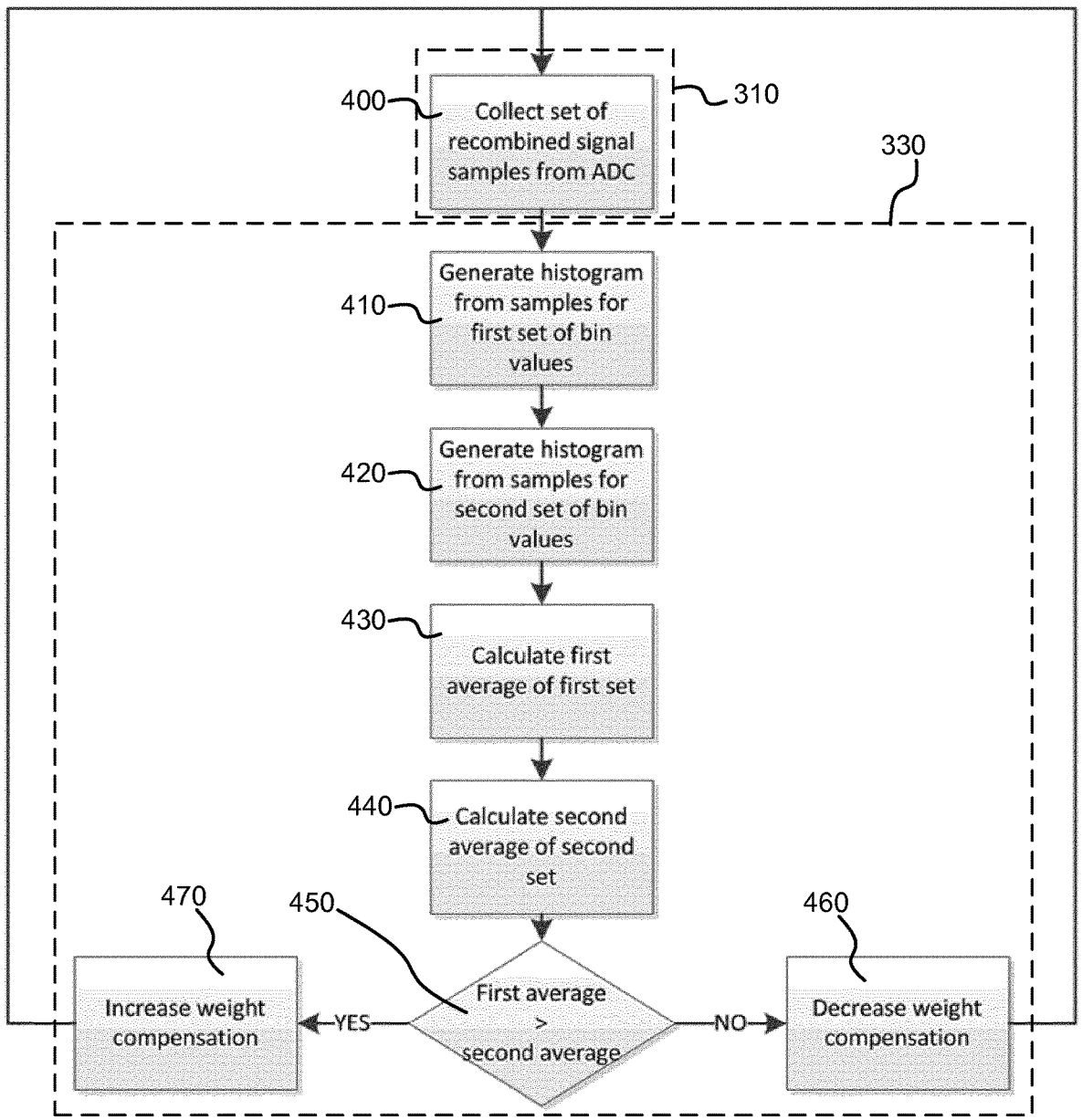

FIG. 20 is a flow chart illustrating an embodiment of the algorithm described above. In FIG. 20, the parameter that is estimated is $\tau_c$ (not $P_c$). Dashed boxes with the reference numbers 310 and 330 are included to illustrate how the steps in FIG. 20 relate to steps illustrated in other Figures. First a set of recombined signal samples $y_{recombined}(n)$ are collected in step 400, which can be viewed as comprised in step 310 described earlier. Then, in step 410, a first histogram is generated representing a first region, or first set of bin values, that will be affected by the discharge, or signal decay, as exemplified above. Also, in step 420, a second histogram is generated representing a second region, or second set of bin values, that will essentially not be affected by the discharge. Average values are calculated for respective histogram, corresponding to the numbers $m_1$ and $m_2$ mentioned above, in step 430 and step 440, respectively. The average values are compared in step 450. If the first average ($m_1$) is smaller than the second average ($m_2$), it means that the signal decay is undercompensated and thus $\tau_c$ should be decreased, which is done in step 460. Otherwise, the signal decay is considered overcompensated, and thus $\tau_c$ should be increased, which is done in step 460. The terms "increase" and "decrease" of the weight compensation used in boxes 460 and 470 thus refers to how the parameter $\tau_c$ should be changed. FIG. 20 does not explicitly show step 340 of determining the bit weights. This step is instead implied.

Other metrics may be derived as indication of compensation needed. For example the number of consecutive zero-value entries in the first histogram (the width of the drop) is one such coarse indication, but this will only work for an undercompensated system. For an overcompensated system one could calculate the number of consecutive entries that is larger by a certain ratio compared to the average of the second histogram. Alternatively, one could use a model that assumes that the system is overcompensated when there are no zero-value entries and adjust the parameter accordingly until the system again becomes undercompensated, which would lead to a system that balances on the boarder of being slightly undercompensated.

It can be further envisioned that a combination of estimation techniques can be used as is common practice in many optimization problems. For example, a first mode of estimation and compensation can be based on coarse estimates (like number of consecutive zero-value entries in first histogram as mentioned above) until no further improvement is obtained. After that a second mode of estimation and compensation can be based on more accurate estimate, like the algorithm described above and with reference to FIG. 20.

Figure 21:
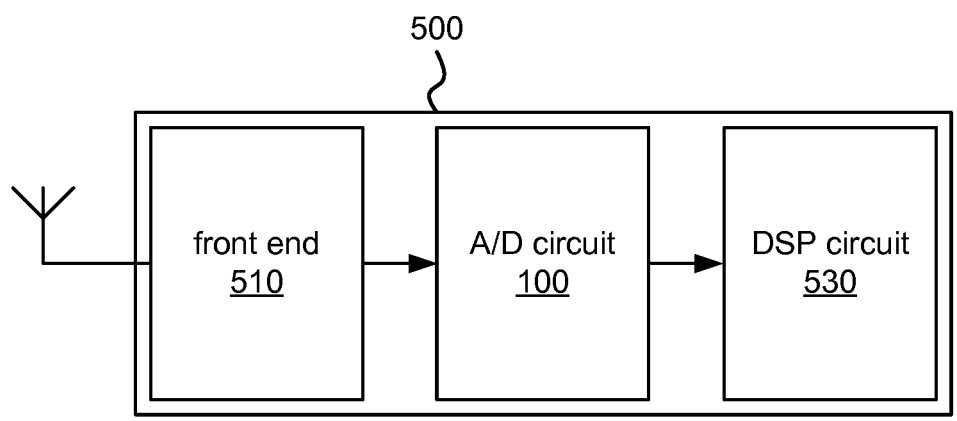
FIG. 21 is a simplified block diagram of a receiver circuit.

FIG. 21 is a block diagram of an embodiment of a receiver circuit 500 comprising the analog-to-digital conversion circuit 100 described above. In FIG. 21, the receiver circuit 500 comprises a front-end circuit 510 arranged to be connected to an antenna. Thus, in FIG. 21, the receiver circuit 500 is depicted as a radio receiver circuit. However, in other embodiments, the receiver circuit may be a wireline receiver circuit, in which case the front-end circuit 510 is arranged to be connected to a wired interface rather than an antenna. The front-end circuit 510 may comprise amplifiers, filters, mixers, etc., configured to generate the analog input signal to the analog-to-digital conversion circuit 100 based on a signal received from the antenna (or wireline interface in case of a wireline receiver circuit). The design of such front-end circuits 510 is well known in the art of receiver design and is not further described herein. In FIG. 21, the receiver circuit 500 comprises a DSP circuit 530 configured to process the digital output signal from the analog-to-digital conversion circuit 100. The DSP circuit 530 may e.g. be configured to perform demodulation and decoding to recover received data. The DSP circuit 530 may e.g. be a so called baseband processor. The design of such DSP circuits 530 is well known in the art of receiver design and is not further described herein. Note that the DSP unit 150 (FIG. 14) may be formed integrally with the DSP circuit 530, or may be formed separately from the DSP circuit 530.

Figure 22:
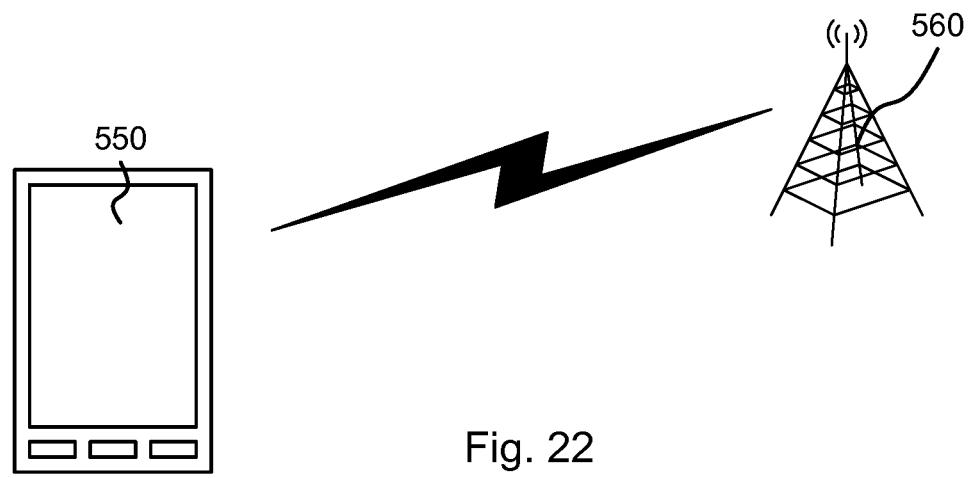
FIG. 22 illustrates communication apparatuses in a communication network.
Figure 23:
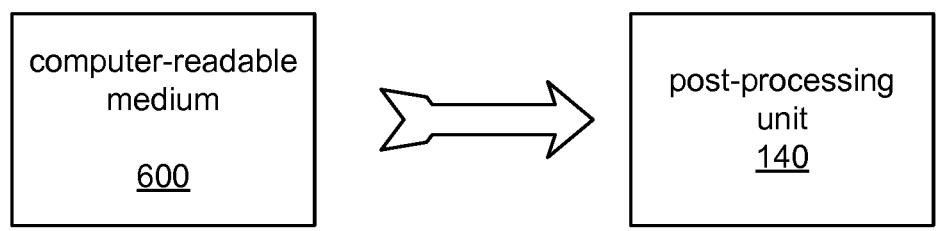
FIG. 23 illustrates a computer-readable medium and a programmable post-processing unit.

The receiver circuit 500 may be comprised in a communication apparatus. FIG. 22 illustrates a wireless terminal 550 and a network node 560 configured to communicate wirelessly with each other. Such wireless terminals 550 and network nodes 560 are examples of communication apparatuses that may comprise the receiver circuit 500. The wireless terminal 550 is depicted in FIG. 22 as a mobile phone. However, other types of wireless terminals are possible as well, such as but not limited to laptop or tablet computers or machine-type communication devices. Similarly, the network node 560 is depicted in FIG. 23 as a base station for a cellular communication network. However, other types of network nodes are possible as well, such as but not limited to access points for wireless local-area networks.

In some embodiments, the post-processing unit 140 may be implemented as a dedicated application-specific hardware unit. Alternatively, said post-processing unit 140, or parts thereof, may be implemented with programmable and/or configurable hardware units, such as but not limited to one or more field-programmable gate arrays (FPGAs), processors, or microcontrollers. Thus, the post-processing unit 140 may be a programmable post-processing unit 140. Hence, embodiments of the present invention may be embedded in a computer program product, which enables implementation of the method and functions described herein, e.g. the embodiments of the methods described with reference to FIGS. 15-19. Therefore, according to embodiments of the present invention, there is provided a computer program product, comprising instructions arranged to cause the programmable post-processing unit 140 to perform the steps of any of the embodiments of said methods. The computer program product may comprise program code which is stored on a computer readable medium 600, as illustrated in FIG. 23, which can be loaded and executed by said programmable post-processing unit 140, to cause it to perform the steps of any of the embodiments of said methods. The computer-readable medium may e.g. be a non-transitory computer-readable medium.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. An analog-to-digital conversion circuit, comprising:
  a switched-capacitor successive-approximation-register (SAR), analog-to-digital converter (ADC), configured to receive an analog input signal and a clock signal, to sample the analog input signal, and to generate a sequence of digital output words corresponding to samples of the analog input signal, wherein the SAR-ADC is configured to generate a bit of a digital output word per cycle of the clock signal;
  a clock-signal generator configured to supply the clock signal to the SAR-ADC;
  a control unit configured to control a rate of the clock signal; and
  a post-processing unit configured to receive the sequence of digital output words and generate a sequence of digital output numbers, corresponding to the digital output words, based on bit weights assigned to the bits of the digital output words, wherein the bit weights depend on the rate of the clock signal, wherein the post-processing unit is configured to determine a parameter representative of a time constant for a decay of a signal level in the SAR-ADC, and determine the bit weights based on said parameter.

2. The analog-to-digital conversion circuit according to claim 1, wherein the post-processing unit is configured to gather statistics of samples of the sequence of digital output words of the SAR-ADC and determine the bit weights based on the statistics of samples of the sequence of digital output words.

3. The analog-to-digital conversion circuit according to claim 1, further comprising an auxiliary ADC configured to convert an analog residue of the SAR-ADC to a sequence, in the following referred to as residue sequence, of digital words corresponding to samples of said analog residue; and
wherein the post-processing unit is configured to gather statistics of samples of the residue sequence, and determine the bit weights based on the statistics of samples of the residue sequence.

4. The analog-to-digital conversion circuit according to claim 3, wherein the SAR-ADC is a stage in a pipeline ADC, and the auxiliary ADC is a subsequent stage in the pipeline ADC.

5. An analog-to-digital conversion circuit, comprising:
a switched-capacitor successive-approximation-register (SAR), analog-to-digital converter (ADC), configured to receive an analog input signal and a clock signal, to sample the analog input signal, and to generate a sequence of digital output words corresponding to samples of the analog input signal, wherein the SAR-ADC is configured to generate a bit of a digital output word per cycle of the clock signal;
a clock-signal generator configured to supply the clock signal to the SAR-ADC; and
a post-processing unit configured to receive the sequence of digital output words and generate a sequence of digital output numbers, corresponding to the digital output words, based on bit weights assigned to the bits of the digital output words, wherein the post-processing unit is configured to determine a parameter representative of a time constant for a decay of a signal level in the SAR-ADC, and determine the bit weights based on said parameter.

6. The analog-to-digital conversion circuit according to claim 5, wherein the post-processing unit is configured to gather statistics of samples of the sequence of digital output words of the SAR-ADC and determine the parameter based on the statistics of samples of the sequence of digital output words.

7. The analog-to-digital conversion circuit according to claim 5, comprising an auxiliary ADC configured to convert an analog residue of the SAR-ADC to a sequence, in the following referred to as residue sequence, of digital words corresponding to samples of said analog residue; and
wherein the post-processing unit is configured to gather statistics of samples of the residue sequence, and determine the parameter based on the statistics of samples of the residue sequence.

8. The analog-to-digital conversion circuit according to claim 5, further comprising a control unit configured to control a rate of the clock signal, wherein the bit weights depend on the rate of the clock signal.

9. A receiver circuit comprising an analog-to-digital conversion circuit, wherein the analog-to-digital conversion circuit comprises:
a switched-capacitor successive-approximation-register (SAR), analog-to-digital converter (ADC), configured to receive an analog input signal and a clock signal, to sample the analog input signal, and to generate a sequence of digital output words corresponding to samples of the analog input signal, wherein the SAR-ADC is configured to generate a bit of a digital output word per cycle of the clock signal;
a clock-signal generator configured to supply the clock signal to the SAR-ADC;
a control unit configured to control a rate of the clock signal; and
a post-processing unit configured to receive the sequence of digital output words and generate a sequence of digital output numbers, corresponding to the digital output words, based on bit weights assigned to the bits of the digital output words, wherein the bit weights depend on the rate of the clock signal, wherein the post-processing unit is configured to determine a parameter representative of a time constant for a decay of a signal level in the SAR-ADC, and determine the bit weights based on said parameter.

10. A communication apparatus comprising a receiver circuit, wherein the receiver circuit comprises an analog-to-digital conversion circuit, wherein the analog-to-digital conversion circuit comprises:
a switched-capacitor successive-approximation-register (SAR), analog-to-digital converter (ADC), configured to receive an analog input signal and a clock signal, to sample the analog input signal, and to generate a sequence of digital output words corresponding to samples of the analog input signal, wherein the SAR-ADC is configured to generate a bit of a digital output word per cycle of the clock signal;
a clock-signal generator configured to supply the clock signal to the SAR-ADC;
a control unit configured to control a rate of the clock signal; and
a post-processing unit configured to receive the sequence of digital output words and generate a sequence of digital output numbers, corresponding to the digital output words, based on bit weights assigned to the bits of the digital output words, wherein the bit weights depend on the rate of the clock signal, wherein the post-processing unit is configured to determine a parameter representative of a time constant for a decay of a signal level in the SAR-ADC, and determine the bit weights based on said parameter.

11. The communication apparatus according to claim 10, wherein the communication apparatus is a wireless terminal.

12. The communication apparatus according to claim 10, wherein the communication apparatus is a network node.

* * * * *